United States Patent
Hsu et al.

(10) Patent No.: US 11,101,366 B2
(45) Date of Patent: Aug. 24, 2021

(54) REMOTE PLASMA OXIDE LAYER

(71) Applicant: Taiwan Semiconductor Manufacturing Company, Ltd., Hsinchu (TW)

(72) Inventors: Iwen Hsu, Hsinchu (TW); Jei Ming Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 2 days.

(21) Appl. No.: 16/372,528

(22) Filed: Apr. 2, 2019

(65) Prior Publication Data

US 2020/0044043 A1    Feb. 6, 2020

Related U.S. Application Data

(60) Provisional application No. 62/712,896, filed on Jul. 31, 2018.

(51) Int. Cl.

| | |
|---|---|
| *H01L 29/66* | (2006.01) |
| *H01L 21/8238* | (2006.01) |
| *H01L 21/311* | (2006.01) |
| *H01L 21/265* | (2006.01) |
| *H01L 21/285* | (2006.01) |
| *H01L 21/02* | (2006.01) |

(52) U.S. Cl.
CPC .... *H01L 29/6656* (2013.01); *H01L 21/02252* (2013.01); *H01L 21/26513* (2013.01); *H01L 21/28518* (2013.01); *H01L 21/31111* (2013.01); *H01L 21/823814* (2013.01); *H01L 21/823821* (2013.01); *H01L 21/823864* (2013.01); *H01L 21/823871* (2013.01); *H01L 29/66545* (2013.01); *H01L 29/66636* (2013.01); *H01L 29/66795* (2013.01)

(58) Field of Classification Search
CPC ......... H01L 29/6656; H01L 21/823821; H01L 21/823814; H01L 21/823864; H01L 21/823871; H01L 29/66795; H01L 21/31111; H01L 21/26513; H01L 21/28518; H01L 29/66545; H01L 29/66636; H01L 21/02252; H01L 27/0924
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 9,034,700 B1 * | 5/2015 | Jeong ................ H01L 29/66818 438/157 |
| 9,536,980 B1 * | 1/2017 | Huang .............. H01L 21/76877 |
| 9,748,389 B1 * | 8/2017 | Lee ........................ H01L 29/161 |
| 9,812,358 B1 * | 11/2017 | Huang ............. H01L 21/02282 |

(Continued)

*Primary Examiner* — Ahmed N Sefer
(74) *Attorney, Agent, or Firm* — Slater Matsil, LLP

(57) ABSTRACT

A remotely generated plasma energizes radicals of a process gas. The radicals of the process gas may interact with a precursor gas to cause a reaction to form an oxide on a region of a workpiece. The formation of the oxide is formed without damaging an underlying layer, such as a low-k dielectric layer. The oxide layer may correspond to a main sidewall oxide over a gate spacer in the formation of a FinFET device.

20 Claims, 23 Drawing Sheets

(56) References Cited

U.S. PATENT DOCUMENTS

| | | | |
|---|---|---|---|
| 10,510,861 B1* | 12/2019 | Yeh | H01L 21/823821 |
| 2003/0040196 A1* | 2/2003 | Lim | H01L 21/02192 |
| | | | 438/785 |
| 2014/0239404 A1* | 8/2014 | Huang | H01L 21/76224 |
| | | | 257/369 |
| 2014/0282326 A1 | 9/2014 | Chen et al. | |
| 2015/0167160 A1* | 6/2015 | Chen | C23C 16/452 |
| | | | 427/58 |
| 2016/0268434 A1* | 9/2016 | Ching | H01L 29/0847 |
| 2017/0062584 A1* | 3/2017 | Basker | H01L 29/161 |
| 2017/0373189 A1* | 12/2017 | Lee | H01L 21/823821 |
| 2018/0190785 A1* | 7/2018 | Hung | H01L 29/66575 |
| 2018/0294184 A1* | 10/2018 | Koh | H01L 29/66545 |
| 2019/0165156 A1* | 5/2019 | Lin | H01L 21/31116 |

* cited by examiner

REMOTE PLASMA OXIDE LAYER

PRIORITY CLAIM AND CROSS REFERENCE

This application claims the benefit of U.S. Provisional Application No. 62/712,896 filed on Jul. 31, 2018, entitled "Remote Plasma Oxide Layer," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
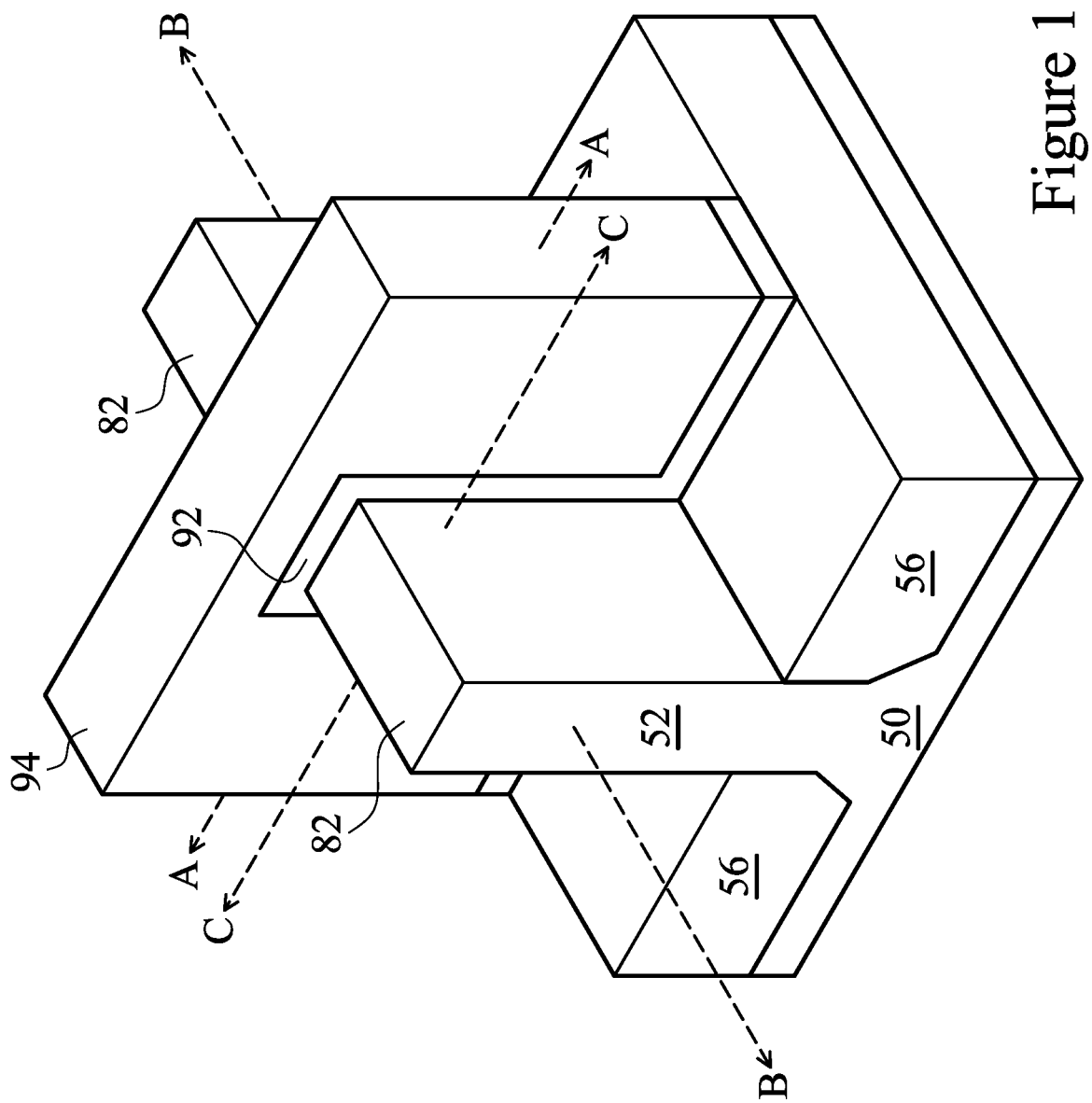
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are described in detail with respect to a specific context, namely, a FinFET device and a method of forming the same. Embodiments provide an oxide layer which is formed by a remote plasma source to protect a spacer of a gate structure during forming the FinFET device. One of skill will recognize, however, that these techniques which are described in detail with respect to a FinFET device may also be applied to other contexts as also described below.

The discussion of embodiments in the context of FinFETs is not intended to limit the application of these techniques in any way. The discussed formation of the FinFET, including the source/drain regions, gate structure, and channel regions of the FinFET are presented as an example. These processes may be altered while staying within the intended scope of the embodiments discussed herein.

Embodiment processes use a remote plasma deposition method to deposit a main sidewall oxide material over a low-k gate spacer. The main sidewall oxide may also be referred to as a screen oxide, sacrificial oxide, or barrier oxide in some implementations. In forming a dummy gate stack over fins of a fin field effect transistor (FinFET), for example, a low-k gate spacer may be deposited over the dummy gate stack and subjected to an anisotropic etch to remove horizontal portions thereof. Following the etch, a main sidewall oxide material may be deposited over the low-k gate spacer. If the main sidewall oxide were formed by other processes, the formation of the oxide may oxidize portions of the low-k gate spacer and when the main sidewall oxide is subsequently removed, those oxidized portions of the low-k gate spacer would also be removed, thereby reducing thickness of the low-k gate spacer and leading to leakage problems. Embodiment processes, however, use a remote plasma source to energize a precursor to form a main sidewall oxide over the low-k gate spacer. Due to the lower energy of the remote plasma source and selection of precursor, damage and/or oxidation of the low-k gate spacer is eliminated or reduced, as discussed in further detail below. When the main sidewall oxide is subsequently removed, the thickness of the low-k gate spacer is maintained, thereby reducing potential for leakage problems.

FIG. 1 illustrates an example of a FinFET in a three-dimensional view, in accordance with some embodiments. The FinFET comprises a fin 52 on a substrate 50 (e.g., a semiconductor substrate). Shallow trench isolation (STI) regions 56 are disposed in the substrate 50, and the fin 52 protrudes above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring STI regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 19B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, 17A, 18A, and 19A are illustrated along reference cross-section A-A illustrated in FIG. 1, and FIGS. 8B, 9B, 10B, 11B, 12B, 13B, 14B, 15B, 16B, 17B, 17C, 18B, and 19B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
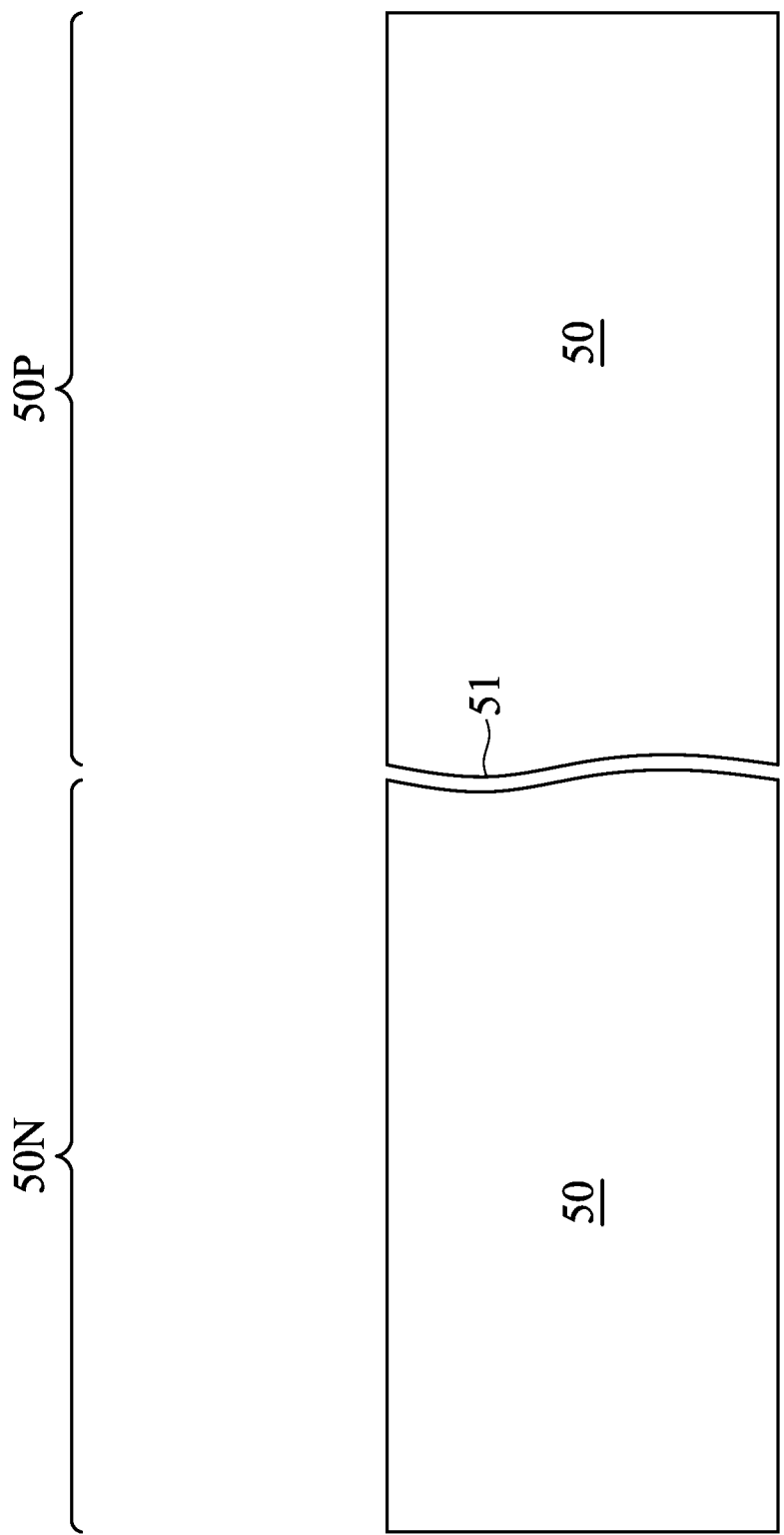
FIGS. 2, 3, 4, 5, 6, 7, 8A, 8B, 9A, 9B, 10A, 10B, 10C, 10D, 11A, 11B, 12A, 12B, 13A, 13B, 14A, 14B, 15A, 15B, 16A, 16B, 17A, 17B, 17C, 18A, 18B, 19A, and 19B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
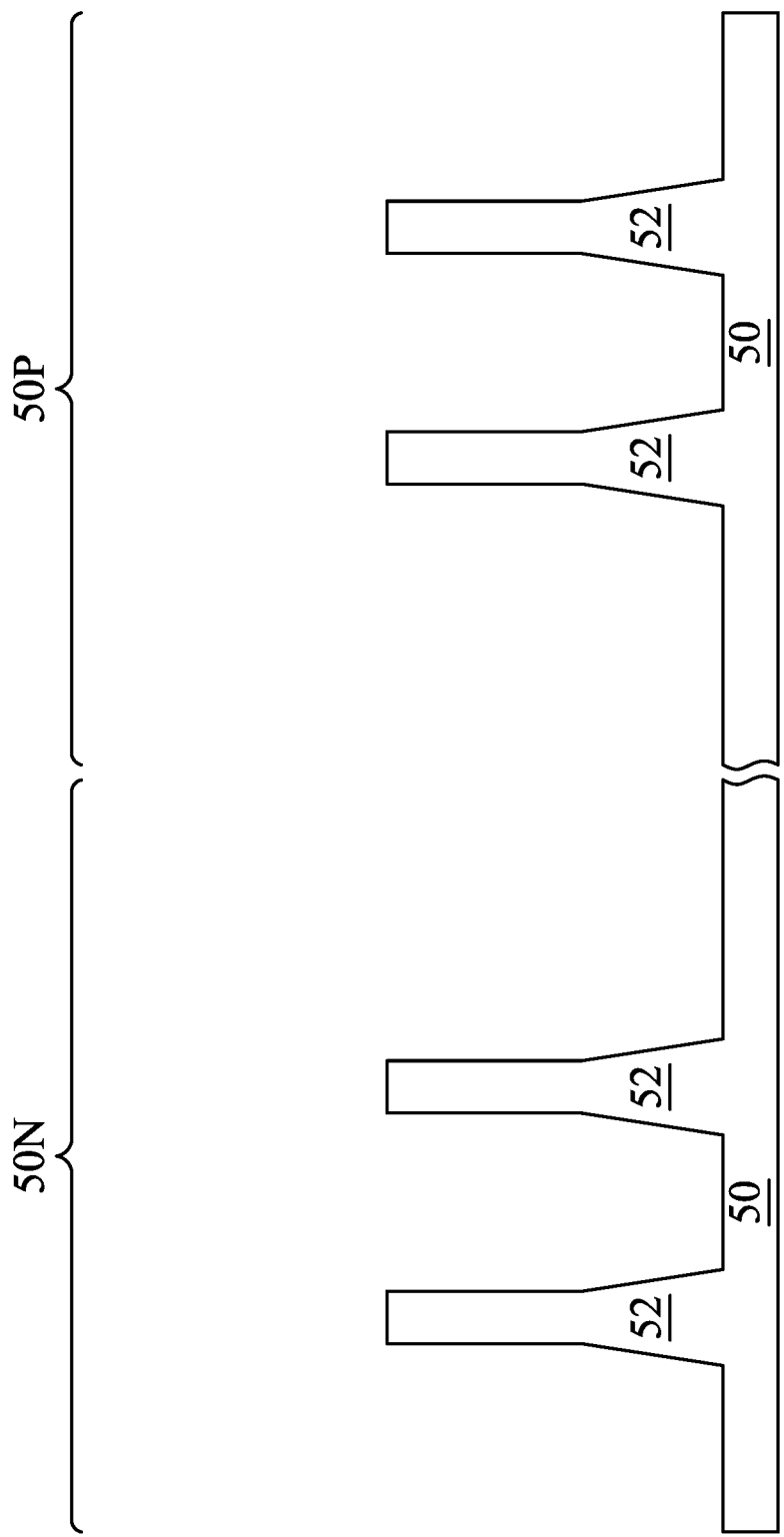

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
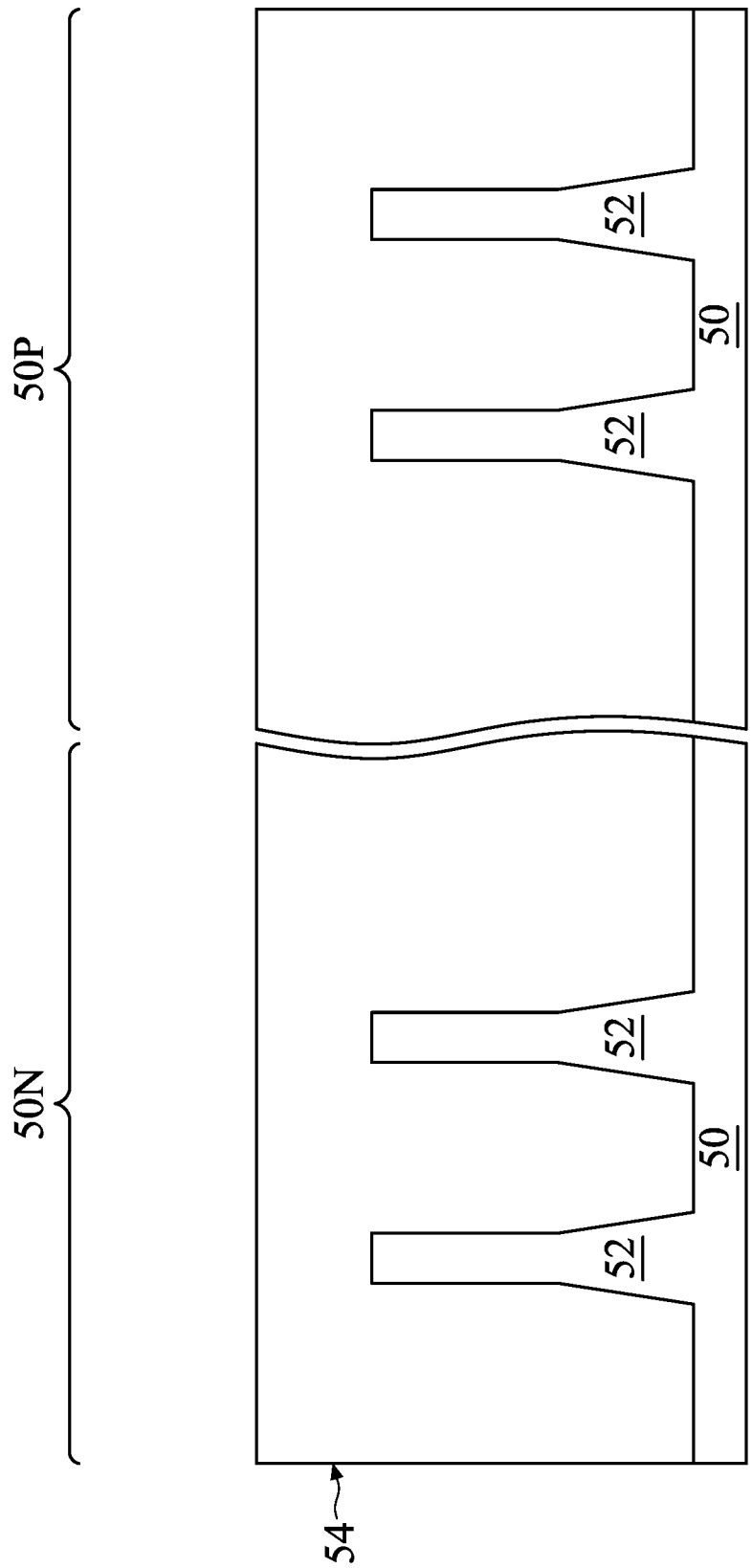

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
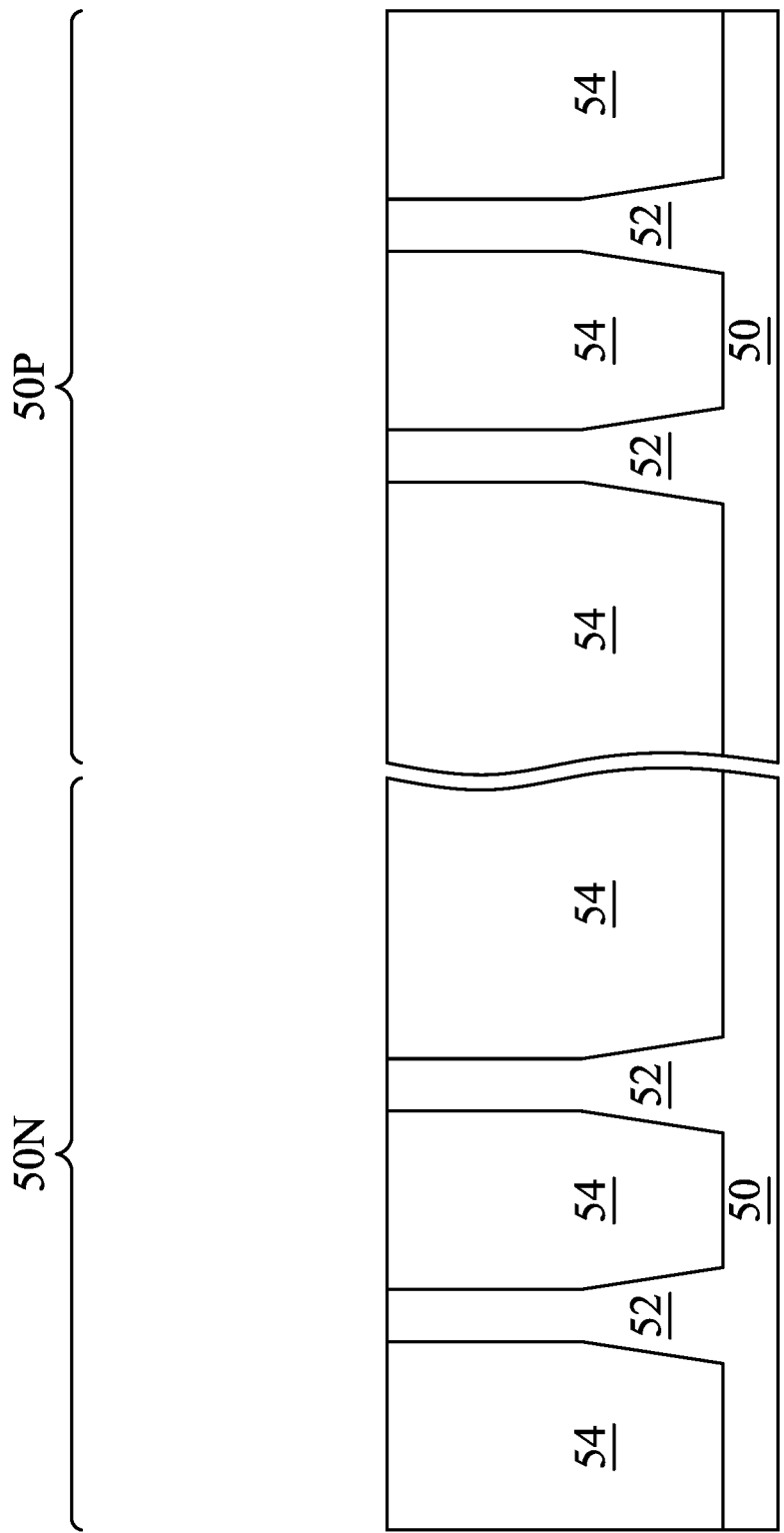

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
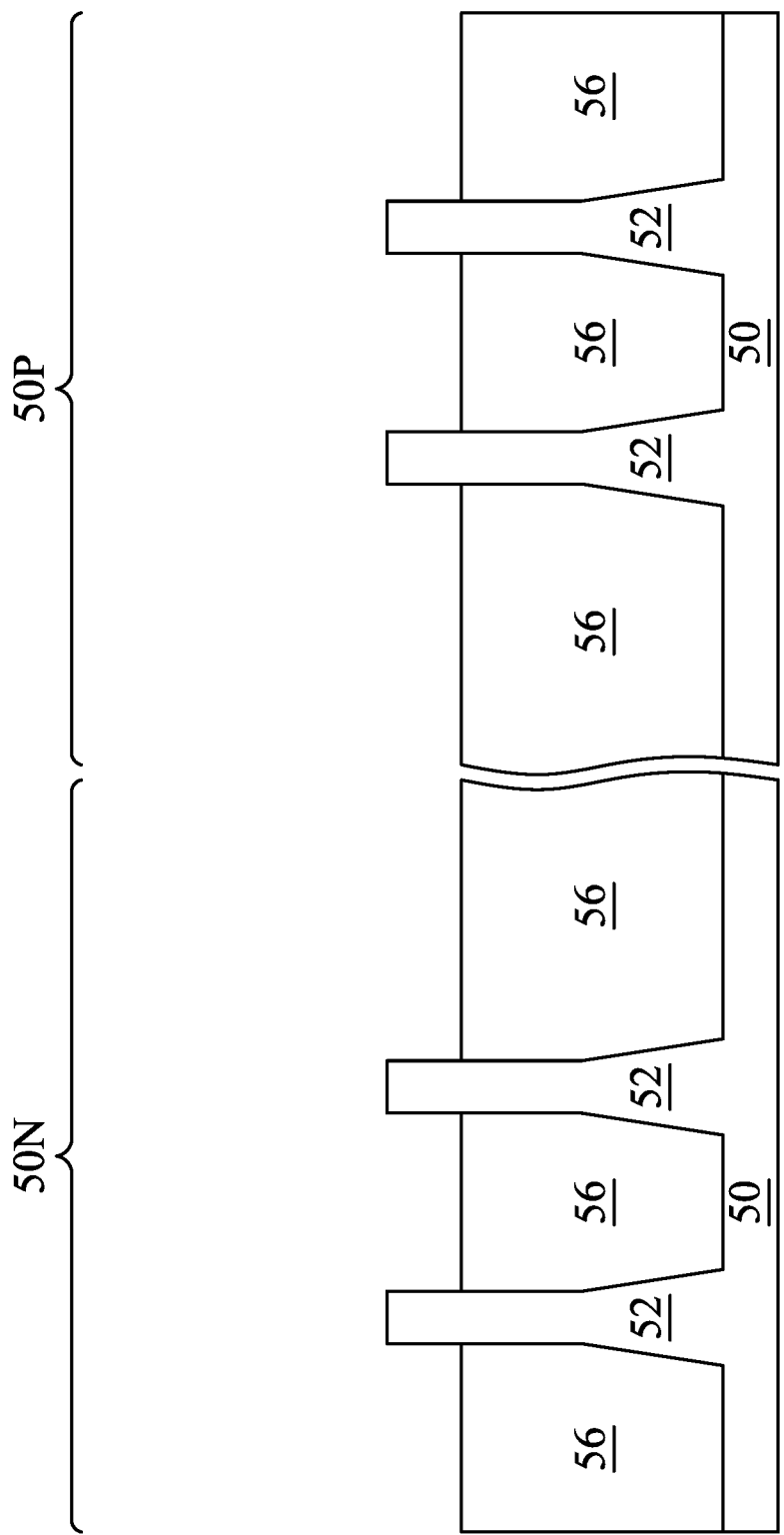

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown. The epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
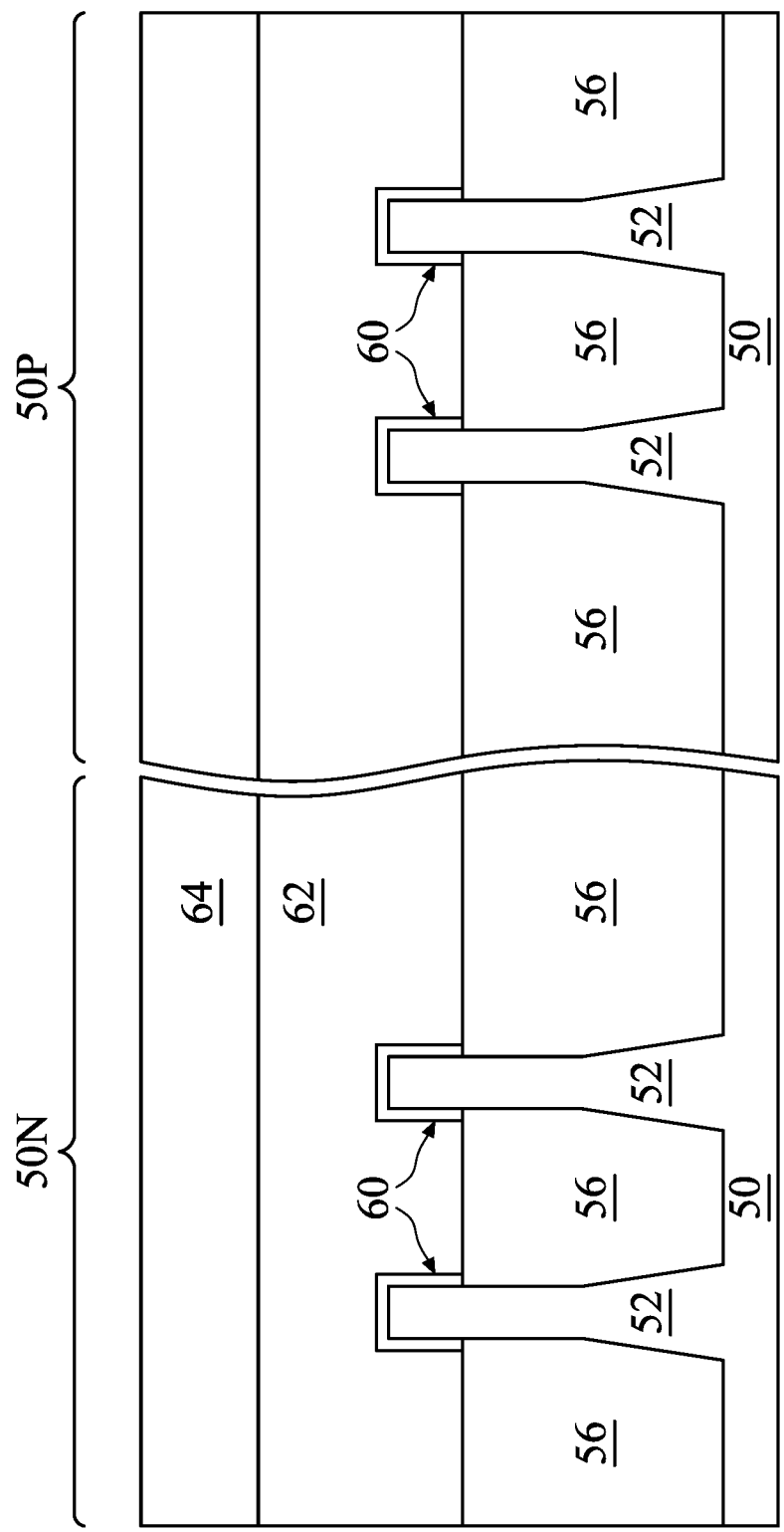

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. In some embodiments, separate dummy gate layers may be formed in the region 50N and the region 50P, and separate mask layers may be formed in the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 19B illustrate various additional steps in the manufacturing of embodiment devices. FIGS. 8A through 19B illustrate features in either of the region 50N and the region 50P. For example, the structures illustrated in FIGS. 8A through 19B may be applicable to both the region 50N and the region 50P. Differences (if any) in the structures of the region 50N and the region 50P are described in the text accompanying each figure.

Figure 8B:
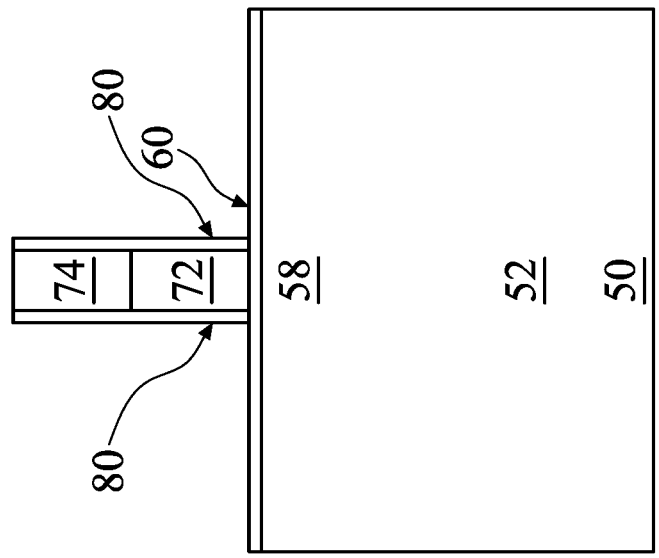
Figure 8A:
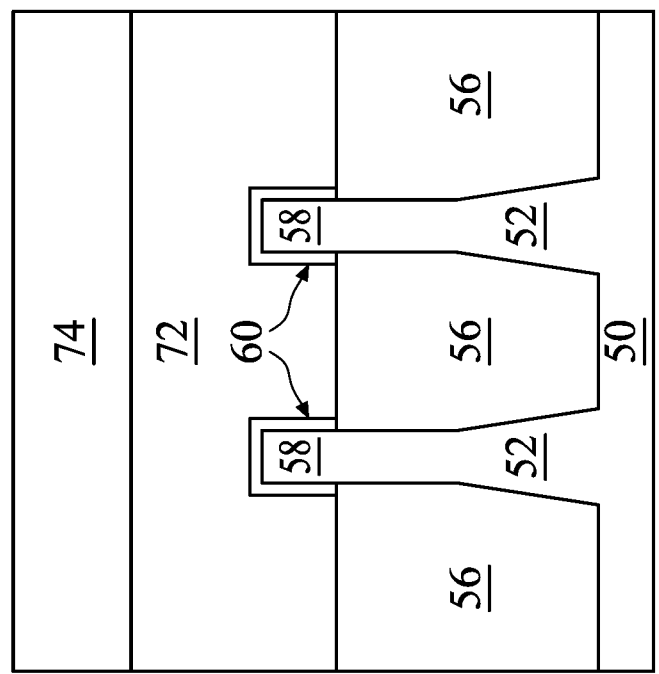

In FIGS. 8A and 8B, the mask layer 64 may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., n-type or p-type) impurities may be implanted into the exposed fins 52 in the region 50P. The mask may then be removed. Subsequently, a mask, such as a photoresist, may be formed over the region 50P while exposing the region 50N, and appropriate type impurities may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
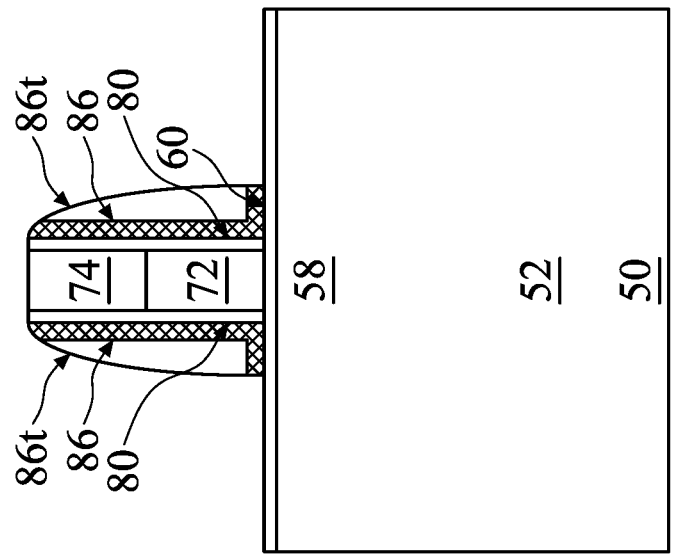
Figure 9A:
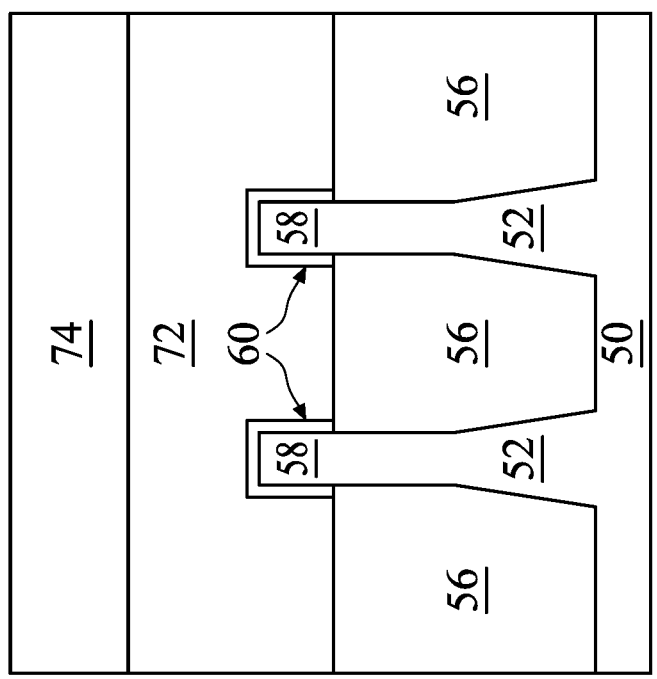

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. In some embodiments, the insulating material of the gate spacers 86 may be a low-k dielectric material, such as phosphosilicate glass (PSG), borophosphosilicate glass (BPSG), fluorinated silicate glass (FSG), $SiO_xC_y$, $SiO_xC_yN_z$, silicon carbon material, compounds thereof, composites thereof, combinations thereof, or the like, by any suitable method, such as CVD, PECVD, atomic layer deposition (ALD), thermal ALD, plasma enhanced (PE) ALD, or the like. Materials suitable for use for the low-k dielectric layers may have k-values between about 2 and 6. In some embodiments, the gate spacers 86 may have a thickness between about 1 nm and about 9 nm, such as about 4 nm or 5 nm, though other dimensions are contemplated. In some embodiments, the gate spacers 86 may be formed from multiple low-k layers, such as 2 or more layers.

In some embodiments, prior to etching gate spacers 86, dummy sidewall spacers 86t are formed over the gate spacers 86, dummy gates 72 and 74, the insulation material 54, and the fins 52. Dummy sidewall spacers 86t may be formed by conformally depositing an insulating material. Subsequently, the insulating material of the dummy sidewall spacers 86t may be anisotropically etched, thereby removing horizontal portions of the dummy sidewall spacers 86t. After etching the dummy sidewall spacers 86t, the insulating material of the gate spacers 86 may then be anisotropically etched, resulting in gate spacers 86 having an el shape where the dummy sidewall spacers 86t remain over a bottom horizontal portion of the gate spacers 86 during etching the gate spacers 86. The insulating material of the dummy sidewall spacers 86t may be silicon nitride, silicon carbide, a combination thereof, or the like and may be formed by any suitable method, such as such as CVD, PECVD, atomic layer deposition (ALD), thermal ALD, plasma enhanced (PE) ALD, or the like. The dummy sidewall spacers 86t may serve as a temporary structure to protect the gate spacers 86 during subsequent formation of an epitaxial source/drain region. In some embodiments, the insulating material of the dummy sidewall spacers 86t may be silicon oxide and may be formed using a remote plasma oxide technique, such as described in greater detail below with respect to the main sidewall oxide 96.

Figure 10B:
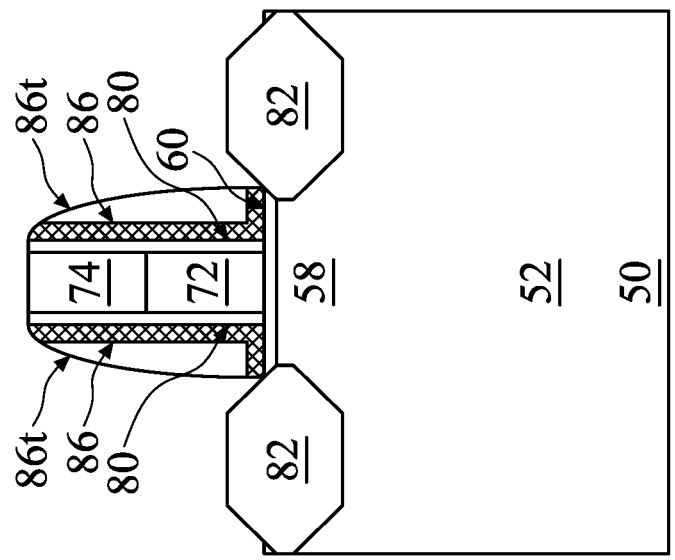
Figure 10A:
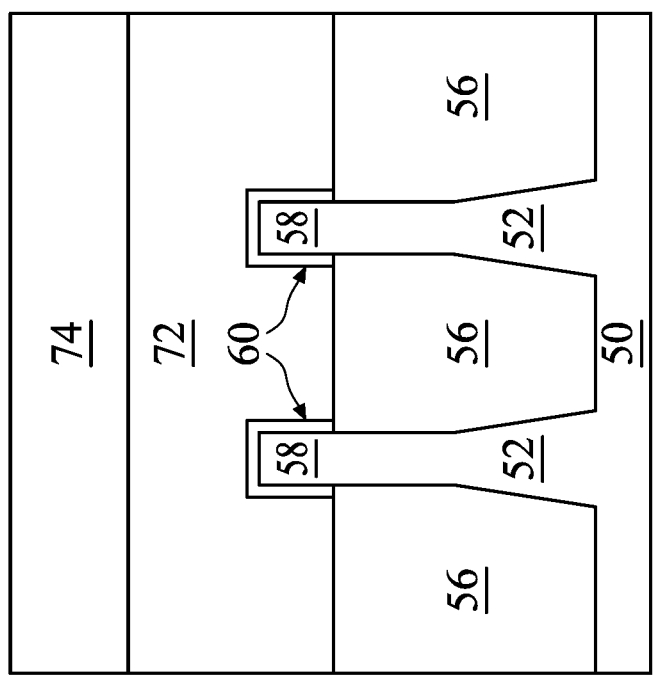
Figure 10C:
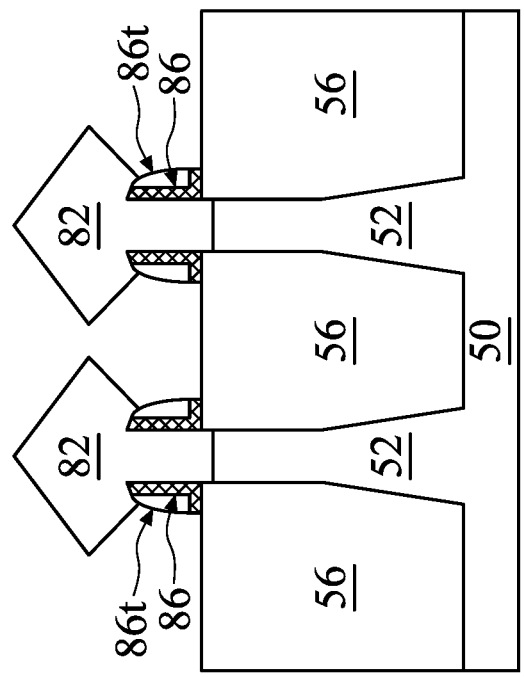
Figure 10D:
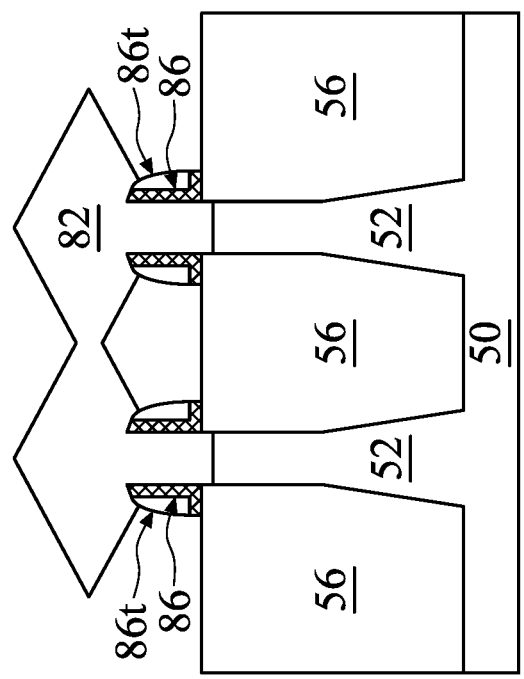

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. Following formation of the epitaxial source/drain regions 82, the dummy sidewall spacers 86t may be removed using an appropriate cleaning wet etch process selective to the material of the dummy sidewall spacers 86t.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

As a result of the epitaxy processes used to form the epitaxial source/drain regions 82 in the region 50N and the region 50P, upper surfaces of the epitaxial source/drain regions have facets which expand laterally outward beyond a sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D.

Figure 11B:
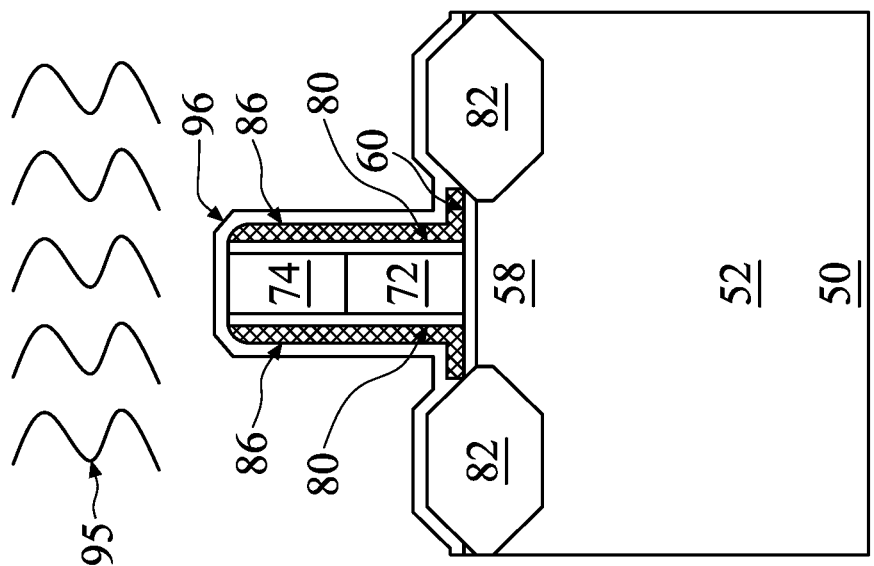
Figure 11A:
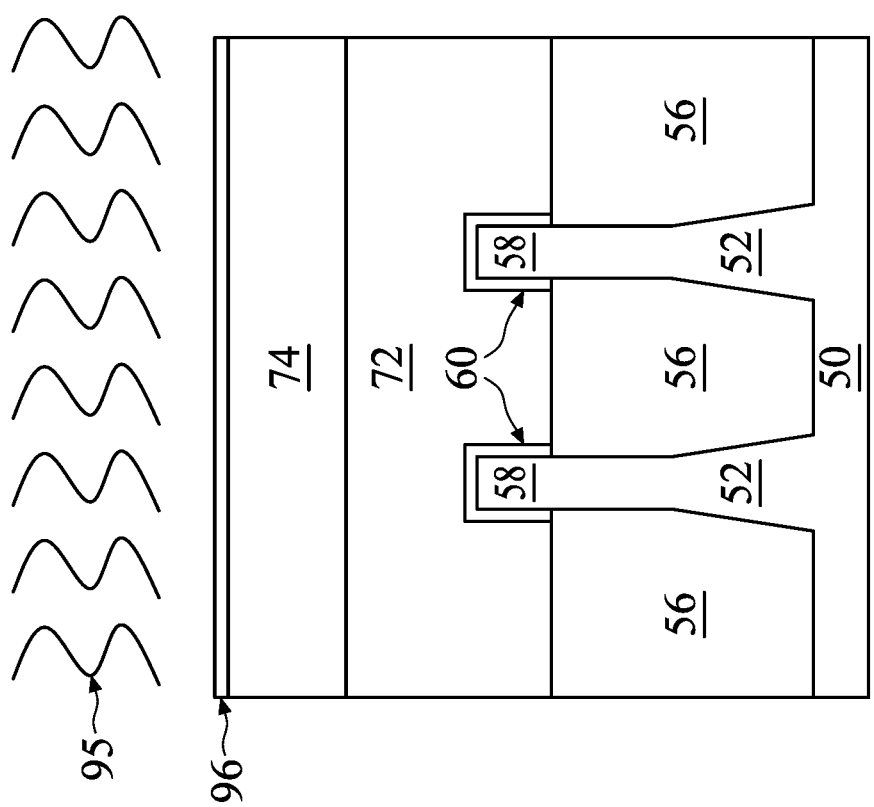

In FIGS. 11A and 11B a main sidewall oxide 96 is formed over the gate spacers 86 and source/drain regions 82 by a remote plasma process 95. The main sidewall oxide 96 may be used to protect the gate spacers 86 and dummy gates 72 during a subsequent implantation process to implant impurities/dopants in the source/drain regions 82. In some embodiments, the main sidewall oxide 96 may be formed conformally, while in other embodiments, the main sidewall oxide 96 may be blanketed over the gate spacers 86 and source/drain regions 82. In some embodiments, instead of removing the dummy sidewall spacers 86t, the dummy sidewall spacers 86t may be used as the main sidewall oxide 96, however, in such embodiments, the dummy sidewall spacers 86t are formed using the techniques described below with respect to the formation of the main sidewall oxide 96.

Rather than form the main sidewall oxide 96 by a direct deposition technique which may damage the low-k material of gate spacers 86, the main sidewall oxide 96 may be formed using the remote plasma process 95. Details of the remote plasma source for the remote plasma process 95 are discussed below with regard to FIGS. 20 through 22. The remote plasma source may be used to generate remote plasma of a process gas (i.e., reactant gas), such as $O_2$. In some embodiments, other process gasses may be used, such as $N_2O$, $NH_3$, combinations thereof, or the like. Other gasses may also be present, such as Ar. Radicals of the process gas are energized and may collide with a precursor which is injected into a process chamber. When the radicals collide with the precursor, a reaction occurs which results in the formation of an oxide network, the oxide network becoming the main sidewall oxide 96. For example, where the oxide network comprises silicon oxide, candidate precursors may include tetramethyl orthosilicate (TMOS), tetraethoxysilane (TEOS), dimethoxydimethylsilane (DMDMS), methyltrimethoxysilane (MTMOS), ethyltrimethoxysilane (ETMOS), vinyltrimethoxysilane (VTMOS), bis(trimethoxysilyl)ethane (BTMSE), trisilylamine (TSA), or combinations thereof (see FIG. 22). Where the oxide network comprises another oxide, other suitable candidate precursors may used in a similar manner as described herein.

In some embodiments, depending on the process gas and precursors used, a nitride network or oxynitride network may be formed when radicals of the process gas collide with the precursor, causing a reaction resulting in the formation of a nitride network or oxynitride network, the nitride network or oxynitride network becoming a sidewall performing a similar function to the main sidewall oxide 96. For example, where the process gas includes $NH_3$ or $N_2O$ a nitride and/or oxynitride may be formed from appropriate precursors. $NH_3$ or $N_2O$ may be disassociated into radicals of O (denoted O*), NO (denoted NO*), and/or $NH_x$ (denoted $NH_x$*).

For example, where a precursor is TMOS, when an oxygen radical O* of an $O_2$ plasma reacts with the TMOS, the energy transfer may result in the following reaction:

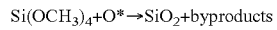

$$Si(OCH_3)_4 + O^* \rightarrow SiO_2 + \text{byproducts}$$

As seen in the above reaction, $SiO_2$ is produced as well as byproducts. Byproducts may include, for example, $CH_3OH$, $CH_2O$, $C_2H_4$, CO, $H_2$, $H_2O$, and so forth. Unreacted portions of the precursor may also remain. Most of the byproducts and unreacted portions of the precursor may be pumped away in chamber by an exhaust system. Some byproducts, however, may be included in the composition of the film of the main sidewall oxide 96. Other candidate precursors will form similar reactions.

In another example, where the process gas includes $NH_3$ or $N_2O$, the $NH_3$ or $N_2$ may be disassociated into O*, NO radicals (denoted NO*), and/or $NH_x$ radicals (denoted $NH_x$*). Where the precursor is trisilylamine (TSA), the reaction can cause break one, two, or three of the TSA Si—N bonds, allowing O* to bind to Si, leading to a chain reaction and forming an oxynitride network.

Figures 20, 21:
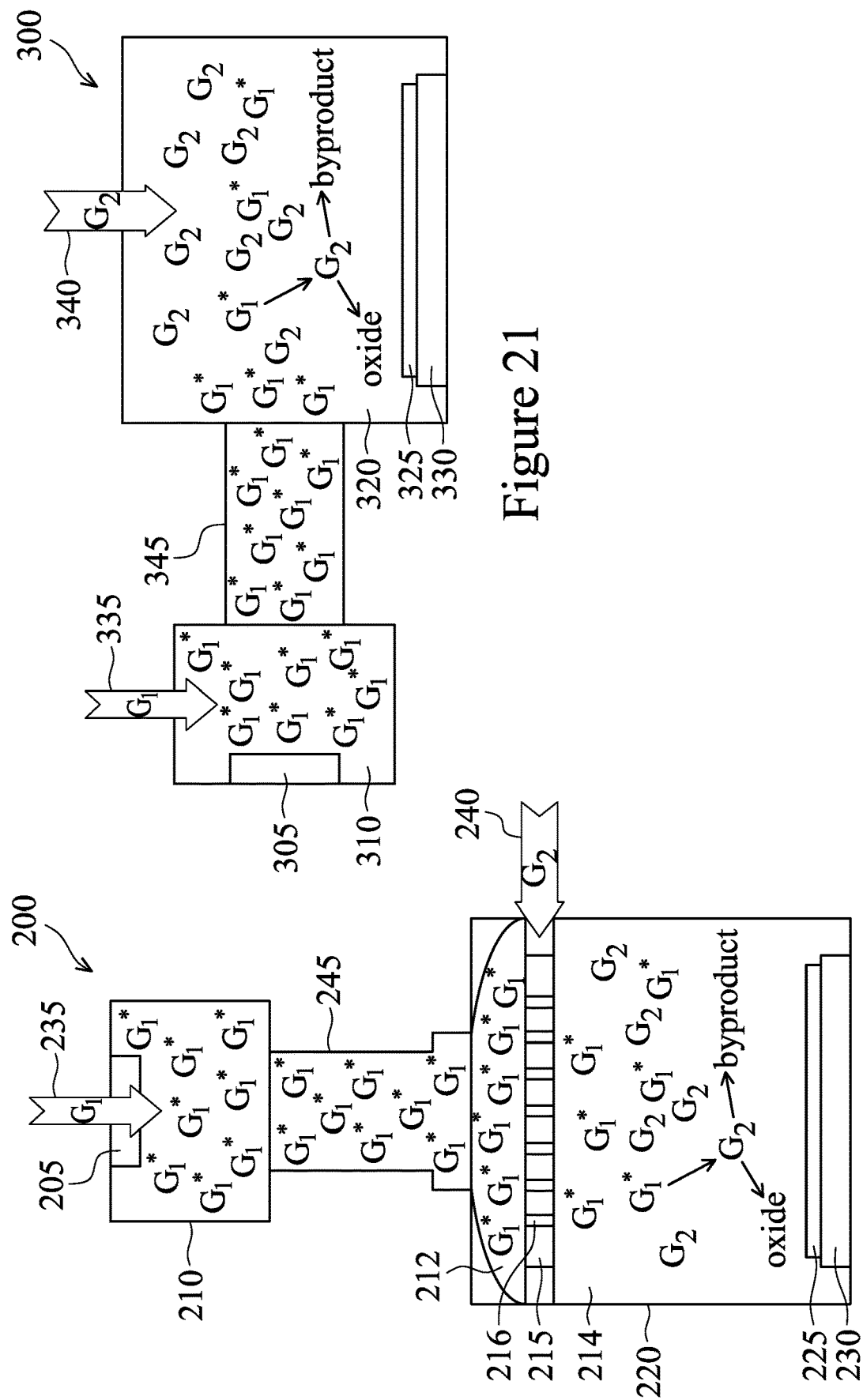
FIGS. 20 and 21 illustrate processing chambers, in accordance with some embodiments.

The remote plasma source may use an RF power in a range from about 1000 W to about 10,000 W to induce and maintain the remote plasma of the process gas (e.g., $O_2$) in the process chamber (see FIGS. 20 through 21). The process chamber may have a chamber pressure in a range from about 0.5 Torr to about 5 Torr, such as about 1 Torr. In some embodiments, the deposition process may be performed for a duration in a range from about 5 seconds to about 100 seconds, such as about 10 to 30 seconds. Process temperature may be maintained between about 40° C. and about 90° C. Other process conditions, such as flow rate and pumping speed of the candidate precursor, idle time before or after deposition, UV curing process time, dosage, and so forth may be altered as desired to achieve a desired deposition profile. In some embodiments, the precursor may be provided at a flow rate or dosage between about 200 sccm and about 900 sccm, such as about 500 sccm. The process gas flow rate or dosage may be between about 100 sccm to about 600 sccm, such as about 300 sccm. The pumping speed of the precursor and process gasses may be maintained to keep the pressure constant (for example, by allowing the pump to control pumping speed by a throttle valve based on chamber pressure). Idle time before or after deposition may be between about 10 seconds and 120 seconds, such as about 30 seconds. UV curing process time may be between about 30 seconds and 600 seconds, such as about 150 seconds. UV curing encourages silicon-oxygen bonding and longer UV curing therefore generally forms a denser oxide network. Flow rate or dosage of carrier (inert) gasses may be between about 1000 sccm and about 30,000 sccm, such as about 5,000 sccm. Other values for the process conditions may be used as appropriate and are contemplated. In some embodiments, a ratio of the precursor reaction gas to the available radicals may be about 2 to 1. A higher ratio of precursor reaction gas provides that fewer oxygen radicals remain unreacted which would have instead reached and reacted with the low-k material of the gate spacers 86, thereby damaging the gate spacers 86.

In some embodiments, the process chamber (see, e.g., FIG. 20) may include a remote plasma source which is separated from a workpiece which includes regions 50N and/or 50P (see FIG. 7) by a gas distribution plate with openings formed therein to provide the remote plasma from an upper chamber of the process chamber to a lower chamber of the process chamber. Thus, the workpiece is out of the direct line of the remote plasma by the interposition of the gas distribution plate. The gas distribution plate may diffuse radicals from the upper chamber to the lower chamber, thereby reducing the number and/or intensity of the available radicals in the lower chamber. Candidate precursors may be injected into the lower chamber. This will be described in greater detail below.

In some embodiments, the process chamber (see, e.g., FIG. 21) may include a remote plasma source located adjacent to the processing chamber. Remote plasma is generated and then provided by a plasma transferring chamber into the processing chamber which houses a workpiece which includes region 50N and/or 50P (see FIG. 7). The workpiece is out of the direct line of the remote plasma. Candidate precursors may be injected near the plasma generation, along the plasma transferring chamber, or in the processing chamber. In some embodiments, a gas distribution plate may also be used between the remote plasma source and the processing chamber. This will be described in greater detail below.

In embodiment processes, because the plasma source is a remote oxygen plasma, the low-k material of gate spacers 86 may be left substantially intact (or unchanged) without suffering from oxidation resulting from the oxygen plasma or suffering from decomposition due to higher heat required in other deposition processes. In other words, the material composition of gate spacers 86 may be substantially the same after the formation of the main sidewall oxide 96 as it was prior to the formation of the main sidewall oxide 96. The formation of main sidewall oxide 96 may be altered by adjusting process conditions such as temperature, pressure, flow rate, pumping speed, idle time, UV curing process time, dosage, and so forth, such as discussed above. Other variables may be applied to the precursor, such as gas ratio, flow sequence, and the like.

Figure 12B:
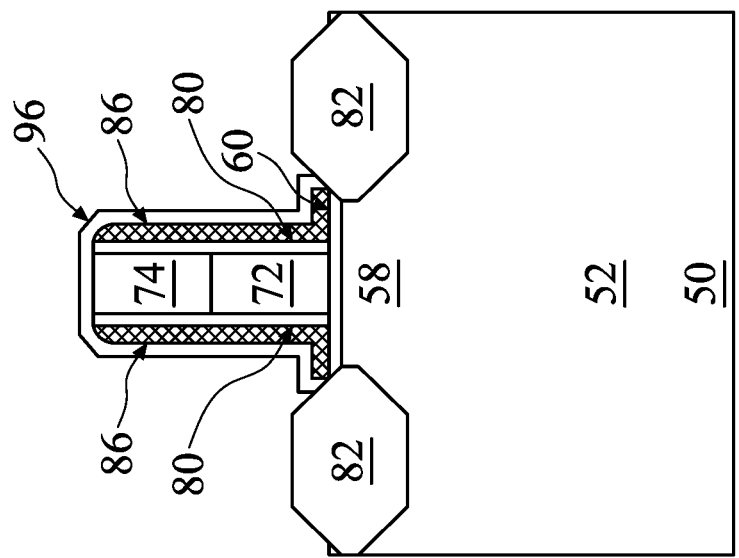
Figure 12A:
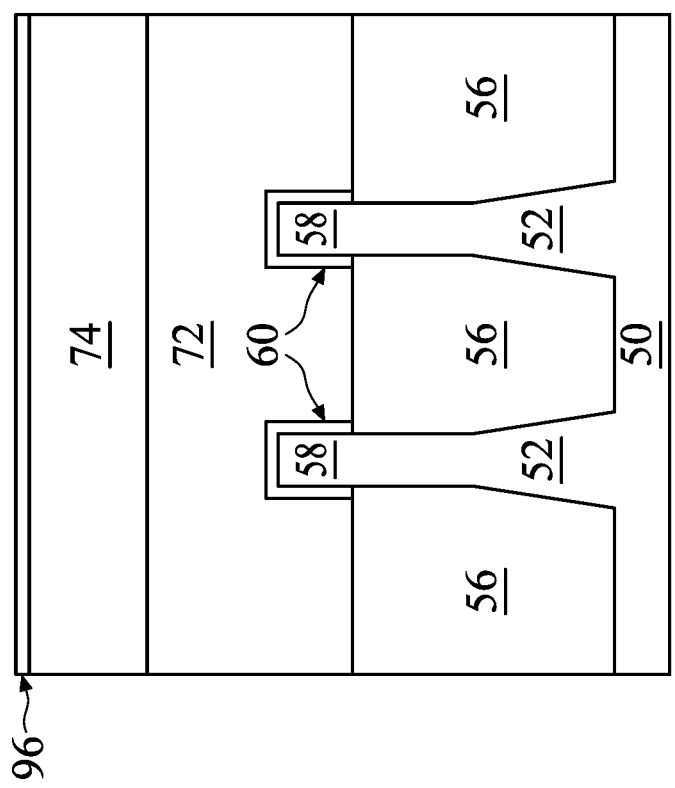

Referring now to FIGS. 12A and 12B, following formation of the main sidewall oxide 96, the main sidewall oxide 96 may be etched using a suitable technique, such as being patterned using acceptable photolithography techniques to expose source/drain regions 82. The exposed epitaxial source/drain regions 82 and/or the fins 52 may be implanted with dopants, similar to the process previously discussed above with respect to FIGS. 8A and 8B for forming lightly doped source/drain regions, followed by an anneal to activate the dopants. The main sidewall oxide 96 may protect the gate spacers 86 from the implant and/or masking materials of the patterning process. The n-type and/or p-type impurities for source/drain regions may be any of the impurities previously discussed. In some embodiments, the epitaxial source/drain regions 82 may be in situ doped during growth.

Figure 13B:
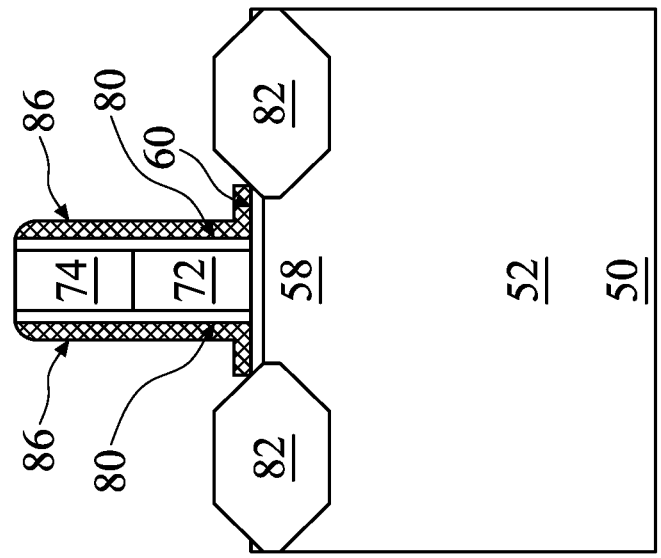
Figure 13A:
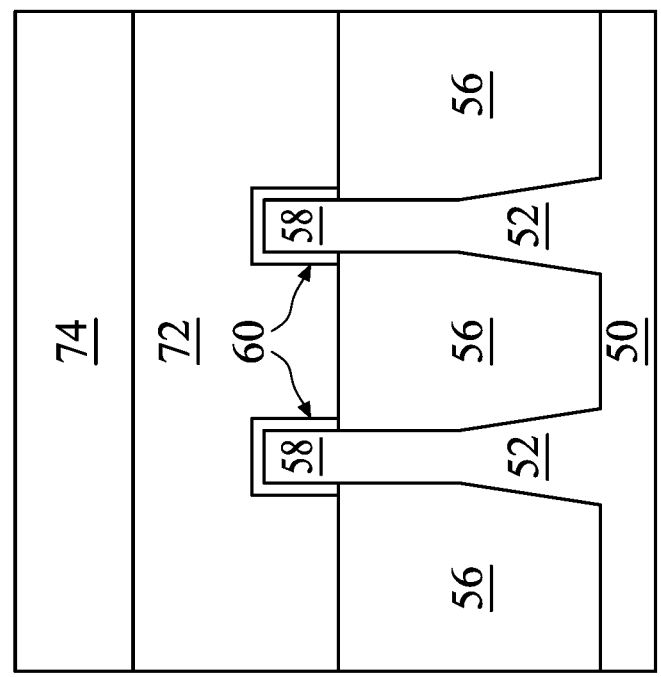

In FIGS. 13A and 13B, following the implantation and activation of dopants, the main sidewall oxide 96 may be removed by any suitable process, such as by a standard cleaning process using any appropriate cleaning agent, such as deionized water, diluted hydrofluoric acid (DHF), $H_2SO_4$, $H_2O_2$, or the like, or combinations thereof. Because the low-k material of gate spacers 86 is undamaged and unoxidized by the process of forming the main sidewall oxide 96, the low-k material of gate spacers 86 may survive the removal of the main sidewall oxide 96 without suffering significant damage. If the main sidewall oxide 96 were formed by other techniques, damage and/or oxidation of the low-k material of gate spacers 86 may compromise the gate spacers 86 so that removal of the main sidewall oxide 96 would inadvertently remove some or all of the gate spacers 86. In contrast, because the main sidewall oxide 96 is formed by a remote oxygen plasma process 95 as described above, damage is prevented or reduced and the gate spacers 86 can survive the removal of the main sidewall oxide 96 substantially intact and without damage. For example, in some embodiments, the thickness of the gate spacers 86 may be the same after removal of the main sidewall oxide 96 as it was before formation of the main sidewall oxide 96. In some embodiments, the thickness of the gate spacers 86 after removal of the main sidewall oxide 96 may be more than 95%, such as between 95% and 100%, of the thickness of the gate spacers 86 after formation of the main sidewall oxide 96. In other words, the thickness of the gate spacers 86 may be reduced by less than 5%, such as between 0% and 5%, by the removal of the main sidewall oxide 96. One or more additional cleaning processes may also be performed. For example, a workpiece including regions 50N and/or 50P may be a wafer and various cleaning processes may be performed on the wafer, e.g., a bevel cleaning process.

Figure 14B:
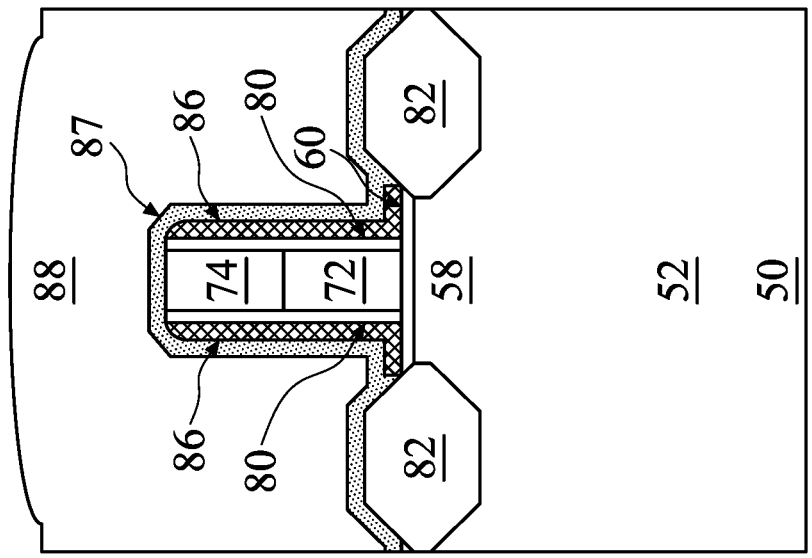
Figure 14A:
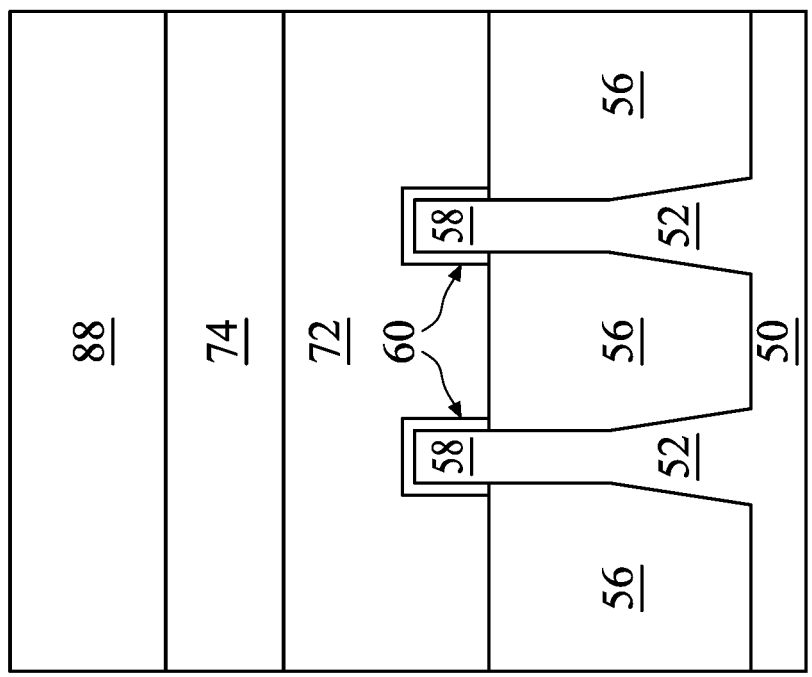

In FIGS. 14A and 14B, a first inter-layer dielectric (ILD) 88 is deposited over the structure following the processes described with respect to FIGS. 11A and 11B. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used. In some embodiments, a contact etch stop layer (CESL) 87 is disposed between the first ILD 88 and the epitaxial source/drain regions 82, the mask 74, and the gate spacers 86. The CESL 87 may comprise a dielectric material, such as, silicon nitride, silicon oxide, silicon ox nitride, or the like, having a different etch rate than the material of the overlying first ILD 88.

Figure 15B:
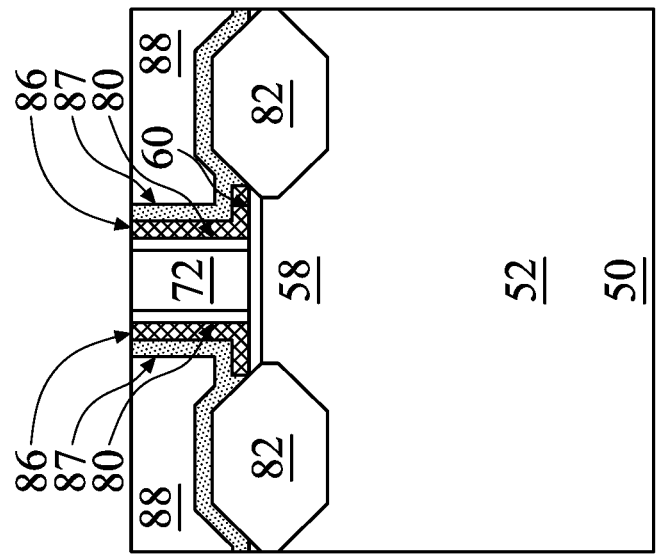
Figure 15A:
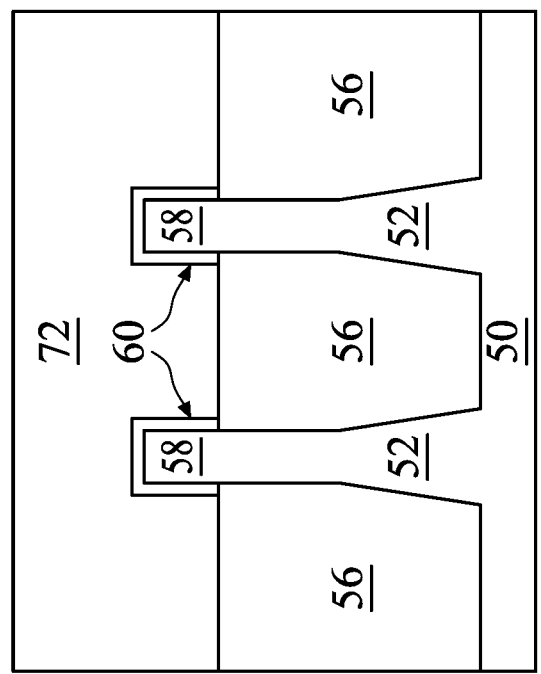

In FIGS. 15A and 15B, a planarization process, such as a CMP, may be performed to level the top surface of the first ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88.

Figure 16B:
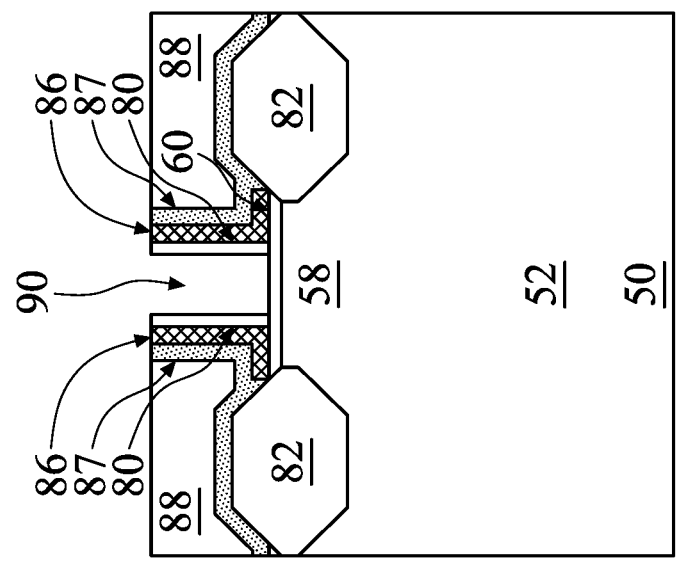
Figure 16A:
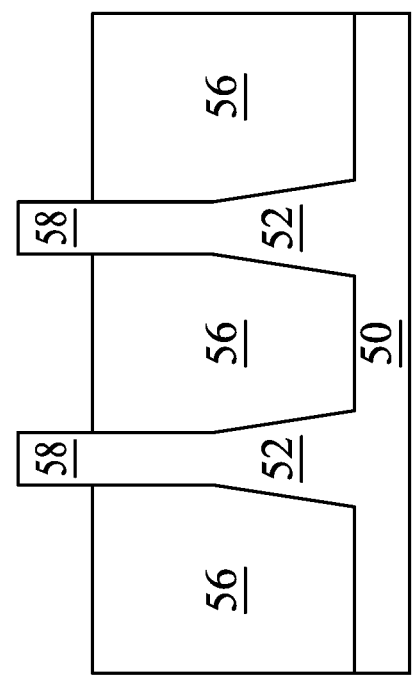

In FIGS. 16A and 16B, the dummy gates 72 are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 17B:
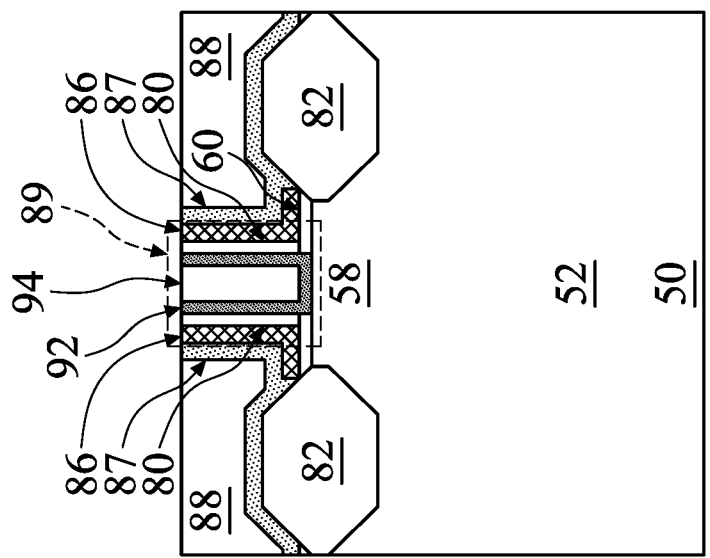
Figure 17A:
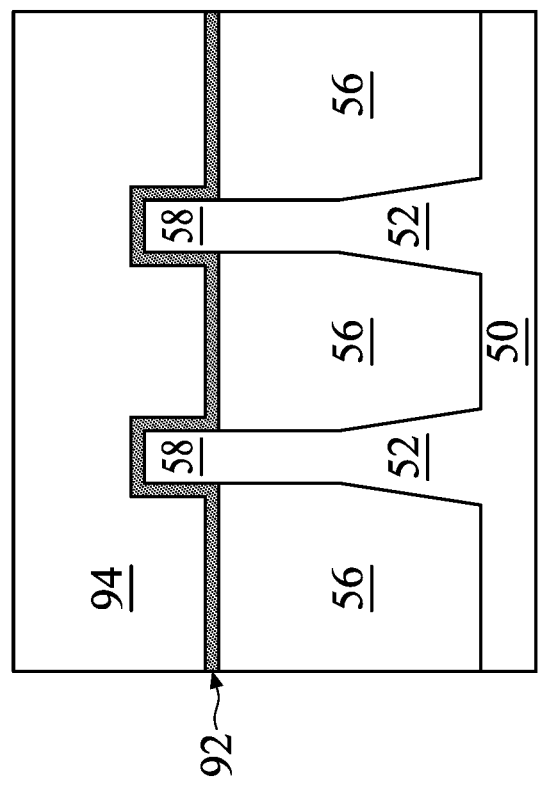
Figure 17C:
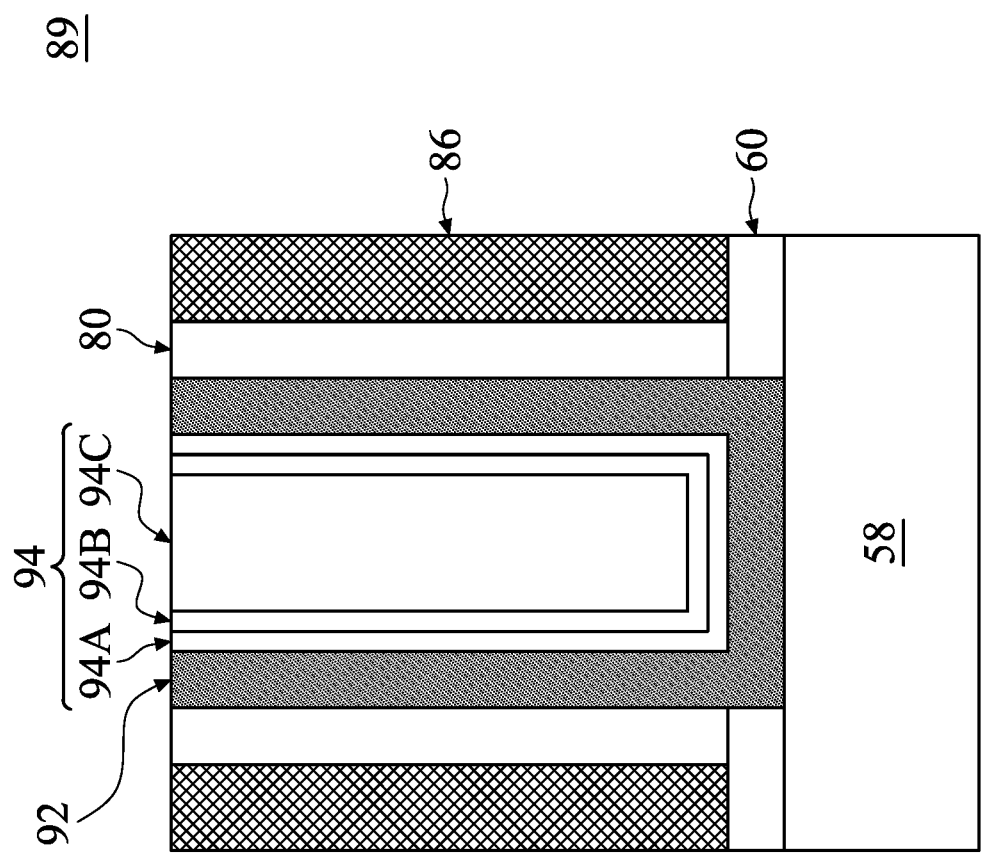

In FIGS. 17A and 17B, gate dielectric layers 92 and gate electrodes 94 are formed for replacement gates. FIG. 16C illustrates a detailed view of region 89 of FIG. 17B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on top surface of the first ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., SiO).

The gate electrodes 94 are deposited over the gate dielectric layers 92, respectively, and fill the remaining portions of the recesses 90. The gate electrodes 94 may be a metal-containing material such as TiN, TiO, TaN, TaC, Co, Ru, Al, W, combinations thereof, or multi-layers thereof. For example, although a single layer gate electrode 94 is illustrated in FIG. 17B, the gate electrode 94 may comprise any number of liner layers 94A, any number of work function tuning layers 94B, and a fill material 94C as illustrated by FIG. 16C. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 18B:
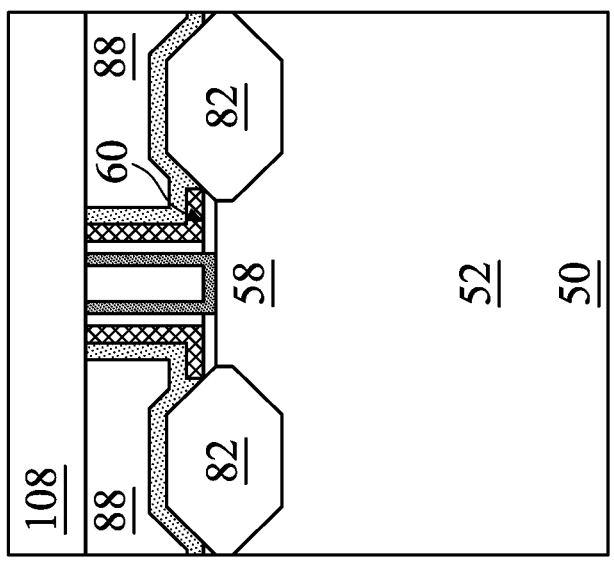
Figure 18A:
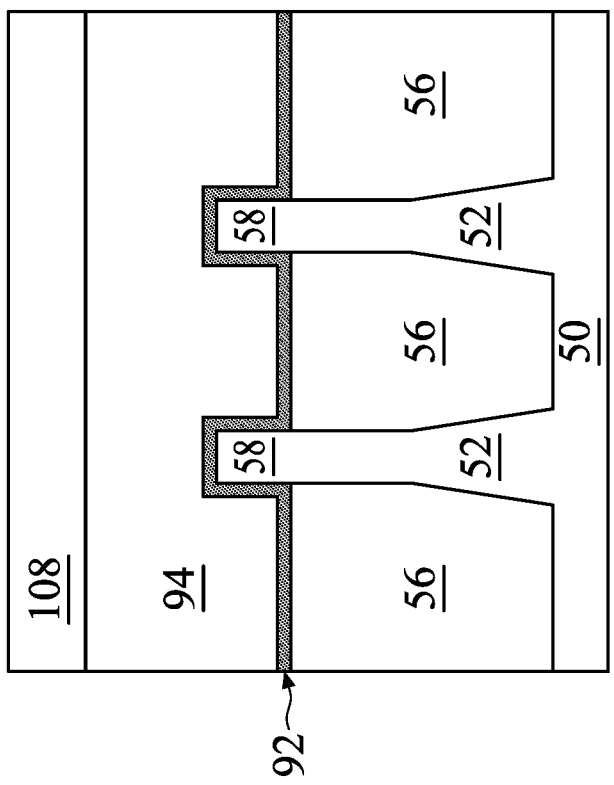

In FIGS. 18A and 18B, a second ILD 108 is deposited over the first ILD 88. In an embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD.

Figure 19B:
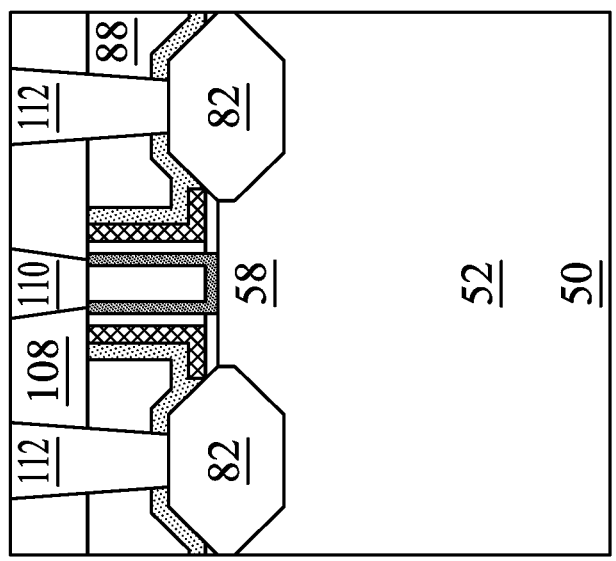
Figure 19A:
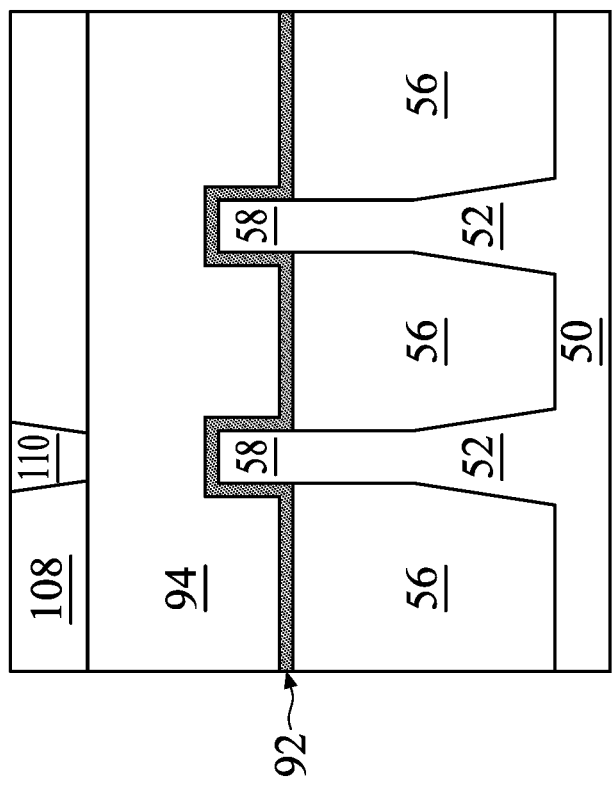

In FIGS. 19A and 19B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

FIGS. 20 and 21 illustrate example processing chambers which may be used to process regions 50N and/or 50P, in accordance with some embodiments. Referring to FIG. 20, a processing chamber 200 is illustrated which includes a remote plasma source 205. Remote plasma source 205 is disposed in an upper chamber 210 of the processing chamber 200. Remote plasma source 205 is configured to generate a plasma from a process gas $G_1$. Process gas $G_1$ may be injected into the upper chamber 210 by gas supply 235. Any suitable process gasses may be used, such as those discussed above with respect to FIGS. 11A and 11B. In the generation of plasma by remote plasma source 205, radicals (denoted $G_1^*$) of the process gas $G_1$ are produced in the upper chamber 210 and transferred to a lower chamber 220 by a plasma transfer chamber 245.

Process chamber 200 may include a gas distribution plate 215 disposed between the plasma transfer chamber 245 and the lower chamber 220 of the process chamber 200, causing a portion of the radicals $G_1^*$ to be out of direct line with a workpiece 225 which is disposed on a pedestal 230 in the lower chamber 220. The gas distribution plate 215 may be disposed in the lower chamber 220 to divide the lower chamber 220 into an upper portion 212 and a lower portion 214 where a subsequent reaction will take place. Gas distribution plate 215 contains holes 216 disposed therein which allow a portion of the radicals $G_1^*$ of the process gas $G_1$ to move from the upper chamber to the lower chamber 220. Gas distribution plate 215 may be grounded. Some radicals $G_1^*$ will strike the gas distribution plate 215 and become de-energized. Some radicals $G_1^*$ will pass through holes 216 into the lower chamber 220.

A precursor gas $G_2$ may be injected into the lower portion 214 of the lower chamber 220 by gas supply 240. Any suitable precursor gas $G_2$ may be used, such as those discussed above with respect to FIGS. 11A and 11B (and further discussed below with respect to FIG. 22). Gas supply 240 may be configured to inject precursor gas $G_2$ at one or more locations in the lower chamber 220. When radicals $G_1^*$ contact precursor gas $G_2$, the energy of the radicals $G_1^*$ will cause a reaction to occur in which an oxide, such as the main sidewall oxide 96, is formed as well as a byproduct. The oxide will collect onto a workpiece 225 which is disposed on a pedestal 230, forming an oxide layer thereon. Because the reaction is a secondary reaction which is initiated by the radicalized process gasses, the process temperature used to form the oxide layer may be lower than if the oxide were formed in a direct chemical reaction. For example, the process temperature may be between about 40° C. and about 90° C. Also, because the radicalized process gasses are first passed through a gas distribution plate, the number of radicals are reduced, allowing a sufficient energy level to be used to produce and maintain the plasma from remote plasma source 205 while being able to control the number and/or strength of radicals reaching the lower chamber 220 and workpiece 225. As a result, damage to the workpiece 225 caused by plasma or radicals is reduced while the main sidewall oxide 96 is formed.

In some embodiments, the pedestal 230 may be vertically movable to move the workpiece 225 closer to or further from the gas distribution plate 215, to further control the energy to which the workpiece 225 is subjected. For example, where the workpiece 225 is closer to the gas distribution plate 215, there is a higher likelihood that unreacted radicals $G_1^*$ reach the workpiece, which may damage an uppermost layer of the workpiece 225, such as the main sidewall oxide 96 as described with respect to FIGS. 11A and 11B, above. However, it may also be that the closer the workpiece 225 is to the gas distribution plate 215, the faster the deposition of the oxide.

Referring to FIG. 21, a processing chamber 300 is illustrated which includes a plasma source 305 disposed in a plasma generation chamber 310. Plasma generation chamber is connected to a reaction chamber 320 by a plasma transferring chamber 345. Plasma transferring chamber 345 may provide plasma from the plasma generation chamber 310 into a side of the reaction chamber 320. A workpiece 325 is disposed on a pedestal 330 in the reaction chamber 320. Plasma source 305 is configured to generate a plasma from a process gas $G_1$. Process gas $G_1$ may be injected into the plasma generation chamber 310 by gas supply 335. Process gas $G_1$ may comprise any suitable process gasses, such as those discussed above with respect to FIGS. 17A, 17B, and 17C. In the generation of plasma by plasma source 305, radicals (denoted $G_1^*$) of the process gas $G_1$ are produced in the plasma generation chamber 310.

A precursor gas $G_2$ may be injected into the reaction chamber 320 by gas supply 340. Precursor gas $G_2$ may comprise any suitable gas, such as those discussed above with respect to FIGS. 11A and 11B. Gas supply 340 may be configured to inject precursor gas $G_2$ at one or more locations in the reaction chamber 320. In some embodiments, gas supply 340 may be configured to inject precursor gas G2 into the plasma transferring chamber 345 or into the plasma generation chamber 310. When radicals $G_1^*$ are delivered into the reaction chamber 320 via the plasma transferring chamber 345 and contact precursor gas $G_2$, the energy of the radicals $G_1^*$ will cause a reaction to occur in which an oxide is formed as well as a byproduct. The oxide will collect onto the workpiece 325, forming an oxide layer thereon. Because the reaction is a secondary reaction which is instigated by the radicalized process gasses, the process temperature used to form the oxide layer may be lower than if the oxide were formed in a direct chemical reaction. For example, the process temperature may be between about 40° C. and about 90° C. Also, because the radicalized process gasses are not in direct line with the workpiece 325, the number of radicals which contact the workpiece 325 is reduced versus a process chamber where the plasma source is in direct line with the workpiece. As a result, damage to the workpiece 325 caused by plasma or radicals is reduced while the oxide is formed.

In some embodiments, a gas distribution plate may be disposed between the plasma generation chamber 310 and the reaction chamber 320. The gas distribution plate may be similar to gas distribution plate 215 (FIG. 20), but may be mounted vertically. In such embodiments, the gas distribution plate allows further control over the plasma and radicals which reach the reaction chamber 320.

In some embodiments, the pedestal 330 may be vertically movable to move the workpiece 325 closer to or further from the outlet of the plasma transferring chamber 345, to further control the energy to which the workpiece 325 is subjected, such as described above with respect to pedestal 230 of FIG. 20.

It should be noted that the processing chambers 200 and 300 illustrated and described above with respect to FIGS. 20 and 21 are merely examples of a remote plasma system which provide for a reaction derived from radicals of a process gas while maintaining a workpiece out of the direct line of the plasma and radicals by way of physical location and/or by way of an intervening gas distribution plate. Any suitable processing chamber may be used or configured to achieve such a result.

Figure 22:
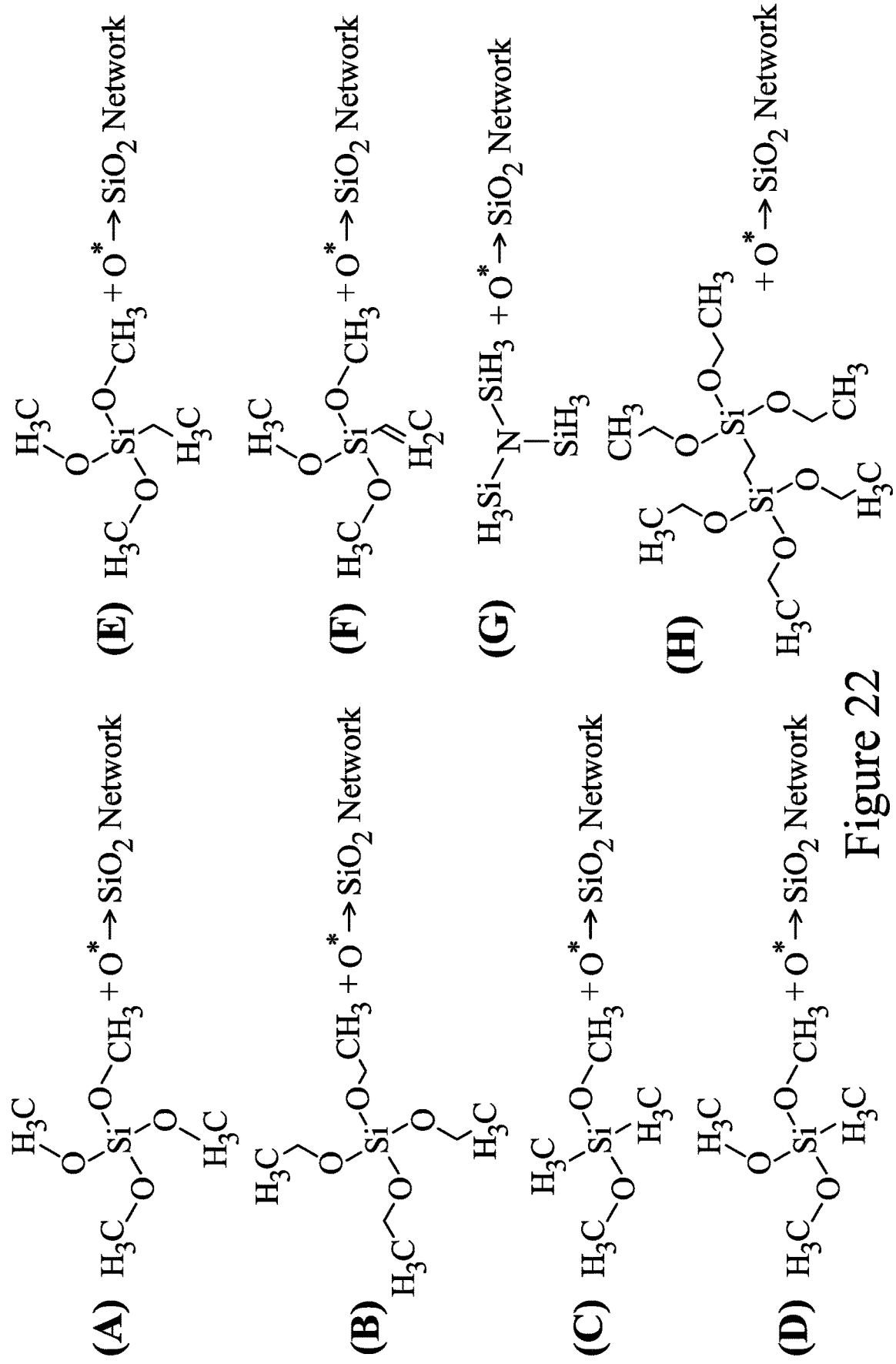
FIG. 22 illustrates chemical structures of candidate precursor gasses and a corresponding chemical reaction, in accordance with some embodiments.

FIG. 22 illustrates chemical compounds for some of the precursor gasses discussed above with respect to FIGS. 11A and 11B. FIG. 22 illustrates chemical structures of some candidate precursor gasses. FIG. 22 (A) illustrates TMOS; (B) illustrates TEOS, (C) illustrates DMDMS; (D) illustrates MTMOS; (E) illustrates ETMOS; (F) illustrates VTMOS; (G) illustrates TSA; and (H) illustrates BTMSE. Other precursor gasses may be used, or combinations thereof. Each of the illustrated compounds, when combined with a radical of oxygen, such as illustrated, forms an $SiO_2$ network as well as byproducts (not shown).

Embodiments provide a deposition technique for an oxide which uses a remotely generated plasma to energize radicals of a process gas. The radicals of the process gas react with a precursor gas to form an oxide on a region of a workpiece. Because the oxide is formed via a remote plasma, damage to a layer underlying the oxide, such as a low-k dielectric layer, may be reduced or eliminated. When the oxide is subsequently removed the underlying layer remains undamaged. This remote plasma deposition technique may be used, for example, in an intermediate process of forming a main sidewall oxide, screen oxide, sacrificial oxide, or barrier oxide in the formation of a FinFET device.

One embodiment is a method including forming a gate stack over one or more semiconductor strips. Gate seal spacers are formed adjacent either side of the gate stack. Low-k gate spacers are formed adjacent to the gate seal spacers, where the low-k gate spacers include a low-k dielectric material. An oxide layer is formed over the low-k gate spacers by a remote oxygen plasma source and precursor gas.

Some embodiments may include one or more of the following additional features or aspects of the method. The method may further include patterning the oxide layer to expose a source/drain region, and implanting a dopant in the source/drain region. The precursor gas may include one or more of tetramethyl orthosilicate (TMOS), tetraethoxysilane (TEOS), dimethoxydimethylsilane (DMDMS), methyltrimethoxysilane (MTMOS), ethyltrimethoxysilane (ETMOS), vinyltrimethoxysilane (VTMOS), bis(trimethoxysilyl)ethane (BTMSE), or trisilylamine (TSA). The remote oxygen plasma source may be in an upper chamber of a processing chamber. The precursor gas may be injected in a lower chamber of the processing chamber. The upper chamber and lower chamber may be separated by a gas distribution plate. The remote oxygen plasma source may be separated from a processing chamber by a plasma transfer chamber. A workpiece including the gate stack may be out of a direct path of the remote oxygen plasma source. Following the formation of the oxide layer, the low-k gate spacers may be substantially free of oxygen. Following the formation of the oxide layer, a material composition of the low-k gate spacers may be the same as prior to the formation of the oxide layer.

Another embodiment is a method including forming a dummy gate structure over and perpendicular to one or more semiconductor strips. Gate spacers are formed on sidewalls of the dummy gate structure, the gate spacers including a low-k dielectric material. A remote oxygen plasma source is activated and a precursor is injected into a processing chamber, where radicals of the remote oxygen plasma source react with the precursor to form an oxide layer over the gate spacers.

Some embodiments may include one or more of the following additional features or aspects of the method. The method may include etching the oxide layer to remove the oxide layer, where prior to etching the oxide layer the gate spacers have a first thickness, where after etching the oxide layer the gate spacers have a second thickness, where the second thickness is greater than 95% of the first thickness. Following the formation of the oxide layer, the gate spacers may be substantially free of oxygen. The gate spacers may have a first material composition prior to forming the oxide layer, and the gate spacers may have a second material composition following forming the oxide layer, where the first material composition is the same as the second material composition. The processing chamber may be separated from the remote oxygen plasma source by a plasma transferring chamber or by a gas distribution plate. These additional features or aspects may be combined into the other embodiments described above.

Another embodiment is a method including forming a gate structure over a semiconductor fin, the semiconductor fin disposed on a workpiece. The method also includes forming a low-k spacer layer on either side of the gate structure. A source/drain region is formed in the semiconductor fin, adjacent the gate structure. An oxide layer is formed on the low-k spacer layer and a dopant is implanted in a source/drain region of the semiconductor fin. The method further includes etching the oxide layer without etching the low-k spacer layer.

Some embodiments may include one or more of the following additional features or aspects of the method. Etching the oxide layer may include wet etching the oxide layer with diluted hydrofluoric acid. Forming the oxide layer may include generating an oxygen plasma remotely from a processing chamber, delivering a first portion of the oxygen plasma to the processing chamber, and providing a precursor gas to the processing chamber, the first portion of the oxygen plasma reacting with the precursor gas to form the oxide layer. The workpiece may be out of a direct path of a source of the oxygen plasma. The workpiece may be separated from a source of the oxygen plasma by a gas distribution plate. These additional features or aspects may be combined into the other embodiments described above.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate stack over one or more semiconductor strips;
    forming gate seal spacers adjacent either side of the gate stack;
    forming low-k gate spacers adjacent to the gate seal spacers, the low-k gate spacers comprising a low-k dielectric material;
    forming an oxide layer over the low-k gate spacers by a remote oxygen plasma source and precursor gas;
    forming a source/drain region in the one or more semiconductor strips; and
    removing the oxide layer, wherein removing the oxide layer causes a thickness of the low-k gate spacers to be reduced, the thickness of the low-k gate spacers being reduced by less than 5%.

2. The method of claim 1, further comprising:
    patterning the oxide layer to expose the source/drain region; and
    implanting a dopant in the source/drain region.

3. The method of claim 1, wherein the precursor gas comprises one or more of tetramethyl orthosilicate (TMOS), tetraethoxysilane (TEOS), dimethoxydimethylsilane (DMDMS), methyltrimethoxysilane (MTMOS), ethyltrimethoxysilane (ETMOS), vinyltrimethoxysilane (VTMOS), bis(trimethoxysilyl)ethane (BTMSE), or trisilylamine (TSA).

4. The method of claim 1, wherein the remote oxygen plasma source is in an upper chamber of a processing chamber.

5. The method of claim 4, wherein the precursor gas is injected in a lower chamber of the processing chamber.

6. The method of claim 5, wherein the upper chamber and lower chamber are separated by a gas distribution plate.

7. The method of claim 1, wherein the remote oxygen plasma source is separated from a processing chamber by a plasma transfer chamber.

8. The method of claim 7, wherein a workpiece comprising the gate stack is out of a direct path of the remote oxygen plasma source.

9. The method of claim 1, wherein following the formation of the oxide layer, the low-k gate spacers are oxidized, an amount of oxidation of the low-k gate spacers being less than 5%.

10. The method of claim 1, wherein following the formation of the oxide layer, a material composition of the low-k gate spacers is the same as prior to the formation of the oxide layer.

11. A method comprising:
    forming a dummy gate structure over and perpendicular to one or more semiconductor strips;
    forming gate spacers on sidewalls of the dummy gate structure, the gate spacers comprising a low-k dielectric material;
    forming dummy spacers over the gate spacers;
    etching a recess adjacent a first semiconductor strip of the one or more semiconductor strips, the dummy spacers protecting the gate spacers during the etching;
    forming a source/drain material in the recess;
    removing the dummy spacers;
    activating a remote oxygen plasma source;
    injecting a precursor into a processing chamber, wherein radicals of the remote oxygen plasma source react with the precursor to form an oxide layer over the gate spacers; and
    etching the oxide layer to remove the oxide layer.

12. The method of claim 11, further comprising:
    wherein prior to etching the oxide layer the gate spacers have a first thickness, wherein after etching the oxide layer the gate spacers have a second thickness, wherein the second thickness is greater than 95% of the first thickness.

13. The method of claim 11, wherein the gate spacers have a first material composition prior to forming the oxide layer, wherein the gate spacers have a second material composition following forming the oxide layer, wherein the first material composition is the same as the second material composition.

14. The method of claim 11, wherein the processing chamber is separated from the remote oxygen plasma source by a plasma transferring chamber or by a gas distribution plate.

15. A method comprising:
forming a gate structure over a semiconductor fin, the semiconductor fin disposed on a workpiece;
forming gate seal spacers adjacent either side of the gate structures;
forming a low-k spacer layer on either side of the gate structure on the gate seal spacers;
forming an oxide layer on the low-k spacer layer by remote deposition;
implanting a dopant in a source/drain region of the semiconductor fin, the source/drain region disposed on either side of the oxide layer, the oxide layer protecting the low-k spacer layer during the implanting; and
etching the oxide layer to remove the oxide layer, wherein during etching the oxide layer the low-k spacer layer is also etched thereby removing material of the low-k spacer layer, wherein less than 5% of the low-k spacer layer is removed.

16. The method of claim 15, wherein etching the oxide layer comprises wet etching the oxide layer with diluted hydrofluoric acid.

17. The method of claim 15, wherein forming the oxide layer comprises:
generating an oxygen plasma remotely from a processing chamber;
delivering a first portion of the oxygen plasma to the processing chamber; and
providing a precursor gas to the processing chamber, the first portion of the oxygen plasma reacting with the precursor gas to form the oxide layer.

18. The method of claim 15, further comprising:
forming an etch stop layer over the source/drain region and on sidewalls of the low-k spacer layer;
forming an inter-layer dielectric over the etch stop layer; and
removing a dummy gate of the gate structure; and
forming a replacement gate.

19. The method of claim 15, wherein following forming the oxide layer, the low-k spacer layer is oxidized by an amount greater than 0% and less than 5%.

20. The method of claim 15, further comprising:
before forming the source/drain region, forming dummy spacers over the low-k spacer layer;
etching recesses in the semiconductor fin for the source/drain region; and
after forming the source/drain region, removing the dummy spacers.

* * * * *